(12) United States Patent
Jin et al.

(10) Patent No.: US 12,250,780 B2
(45) Date of Patent: Mar. 11, 2025

(54) DISPLAY MODULE DRIVING DEVICE, DISPLAY APPARATUS INCLUDING THE SAME, AND DISPLAY APPARATUS DRIVING METHOD USING THE SAME

(71) Applicant: Samsung Display Co., Ltd., Yongin-si (KR)

(72) Inventors: Byoung Jin Jin, Yongin-si (KR); Dongjin Park, Hwaseong-si (KR); Jingyu Sim, Suwon-si (KR); Youngsu Kim, Gunpo-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 233 days.

(21) Appl. No.: 17/894,672

(22) Filed: Aug. 24, 2022

(65) Prior Publication Data

US 2023/0189458 A1     Jun. 15, 2023

(30) Foreign Application Priority Data

Dec. 13, 2021   (KR) .......................... 10-2021-0177875

(51) Int. Cl.
*H05K 5/02*     (2006.01)
*H02K 7/116*    (2006.01)
(Continued)

(52) U.S. Cl.
CPC ........... *H05K 5/0217* (2013.01); *H02K 7/116* (2013.01); *H10K 77/111* (2023.02); *H10K 2102/311* (2023.02)

(58) Field of Classification Search
CPC .......................... H05K 5/0017; H05K 5/0217
(Continued)

(56) References Cited

U.S. PATENT DOCUMENTS

| 10,750,625 B2 | 8/2020 | Park | |
| 2021/0045258 A1* | 2/2021 | Lee | ...................... H05K 5/0017 |

(Continued)

FOREIGN PATENT DOCUMENTS

| CN | 113163034 A | * | 7/2021 | .......... H04M 1/0235 |
| JP | 2019184913 A | | 10/2019 | |

(Continued)

OTHER PUBLICATIONS

International Search Report—PCT/KR2022/012713 dated Nov. 28, 2022.

*Primary Examiner* — Hung S. Bui
(74) *Attorney, Agent, or Firm* — CANTOR COLBURN LLP

(57) ABSTRACT

A display apparatus includes a display module, a rolling cylinder which the display module is wound on and unwound from, and a lifting block unit disposed on a rear surface of the display module. The lifting block unit includes a first block portion, a second block portion coupled to the first block portion and movable up and down with respect to the first block portion, and a third block portion connected to an upper portion of the display module and coupled to the second block portion and movable up and down with respect to the second block portion. The second block portion is inserted into a first accommodation space defined above the first block portion and a second accommodation space defined under the third block portion.

18 Claims, 23 Drawing Sheets

(51) Int. Cl.
*H10K 77/10* (2023.01)
*H10K 102/00* (2023.01)

(58) Field of Classification Search
USPC .......................... 361/807, 727, 728, 809, 810
See application file for complete search history.

(56) References Cited

U.S. PATENT DOCUMENTS

| | | | |
|---|---|---|---|
| 2021/0373602 A1 | 12/2021 | Min | |
| 2022/0269312 A1 | 8/2022 | Choi et al. | |
| 2023/0044285 A1* | 2/2023 | Jin | G06F 1/1652 |
| 2023/0056973 A1* | 2/2023 | Kim | G06F 1/1656 |
| 2023/0209740 A1* | 6/2023 | Ko | G06F 1/1601 |
| | | | 361/807 |

FOREIGN PATENT DOCUMENTS

| | | | | |
|---|---|---|---|---|
| KR | 200445233 Y1 * | 7/2009 | ............ | F16M 11/04 |
| KR | 1020170073958 | 6/2017 | | |
| KR | 101758835 B1 | 7/2017 | | |
| KR | 1020200036409 A | 4/2020 | | |
| KR | 1020200041846 | 4/2020 | | |
| KR | 1020200117741 | 10/2020 | | |
| KR | 102175434 B1 | 11/2020 | | |
| KR | 1020210041665 | 4/2021 | | |
| KR | 1020210053100 A | 5/2021 | | |

\* cited by examiner

FIG. 4
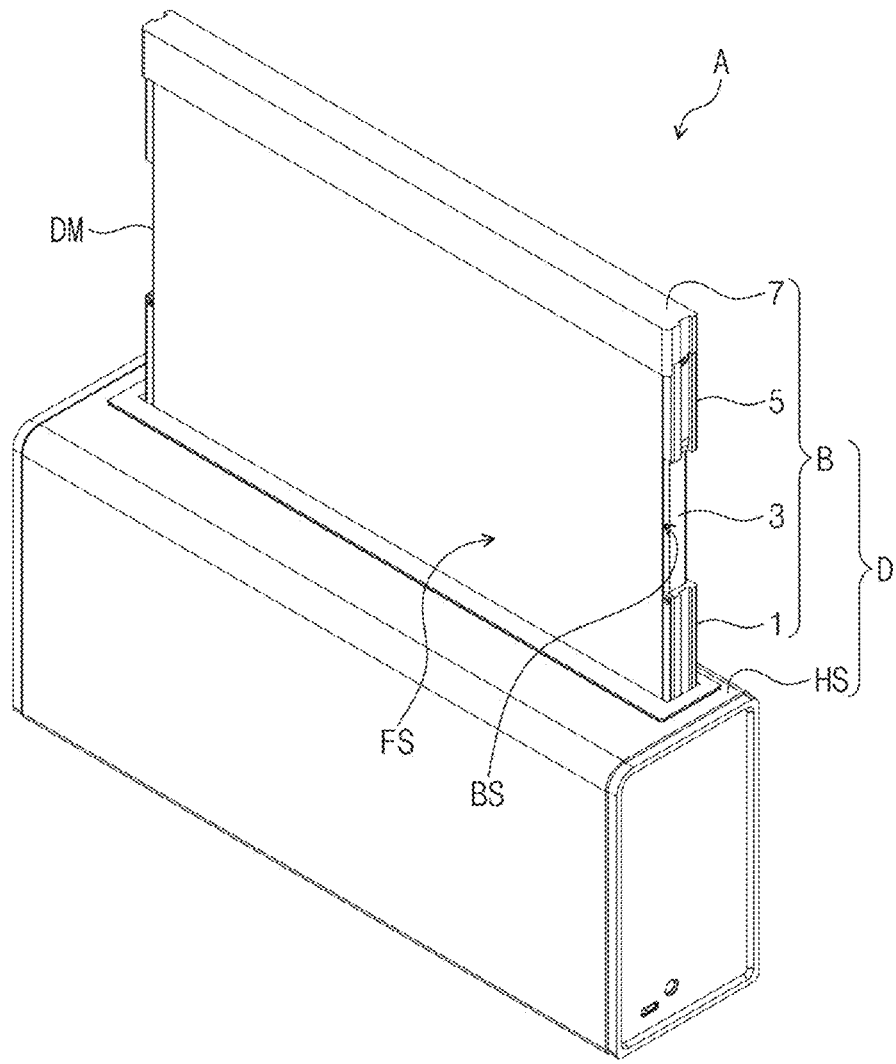
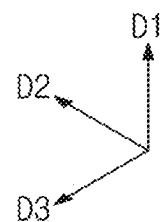

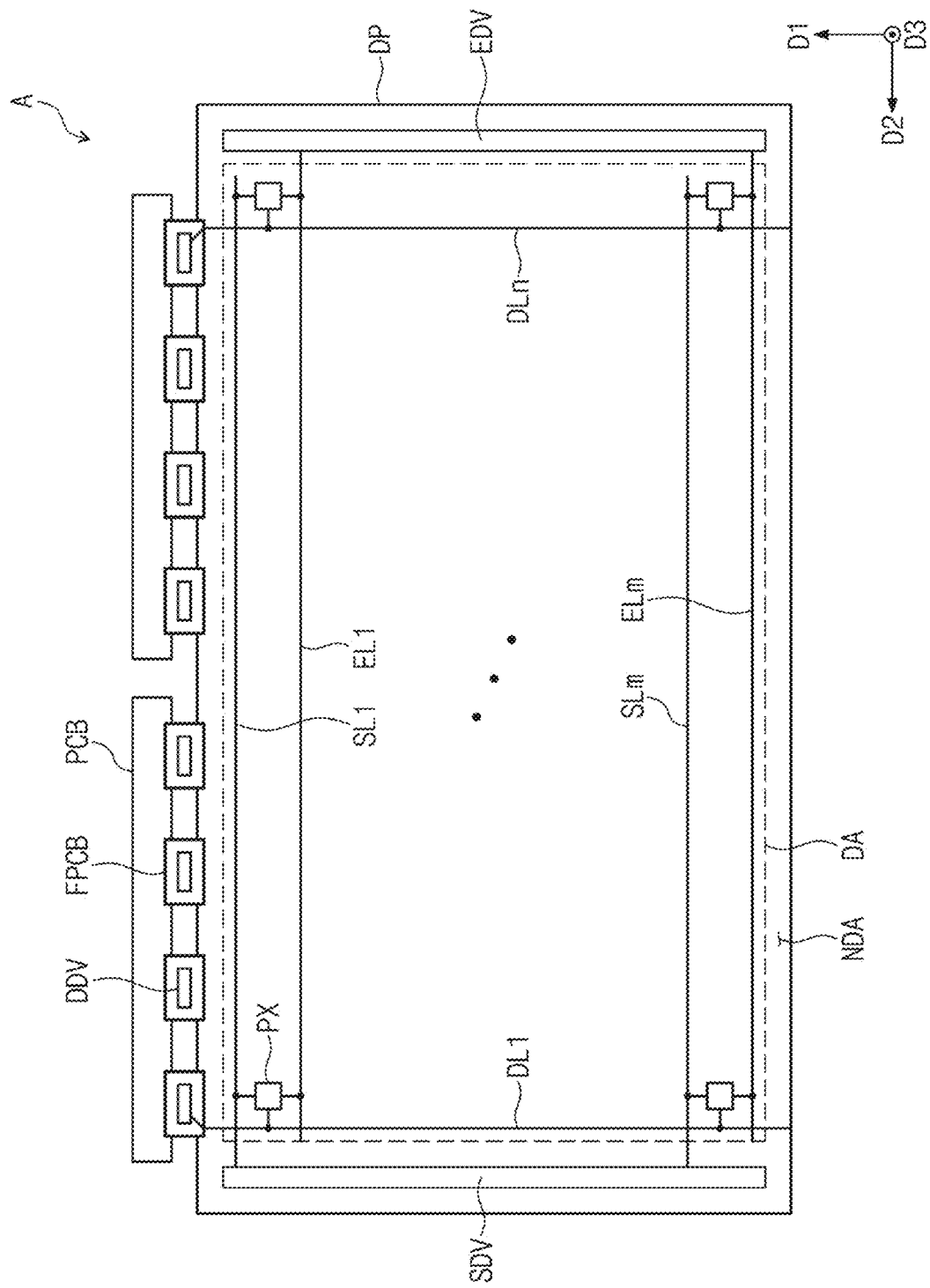

FIG. 13
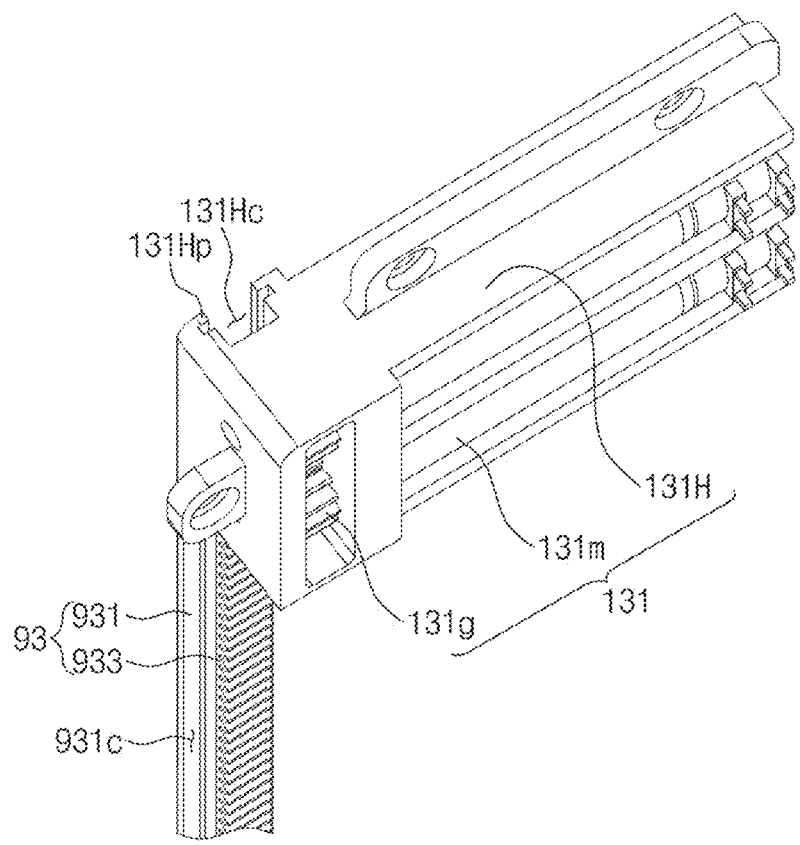
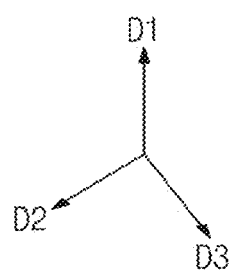

FIG. 14
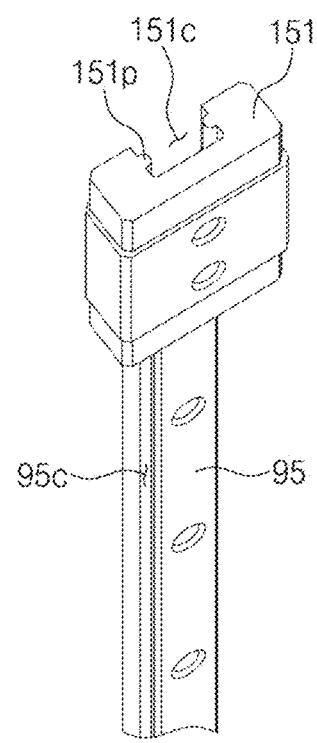
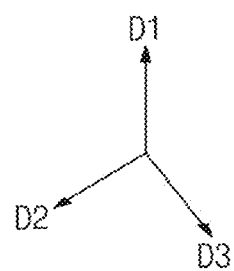

FIG. 16
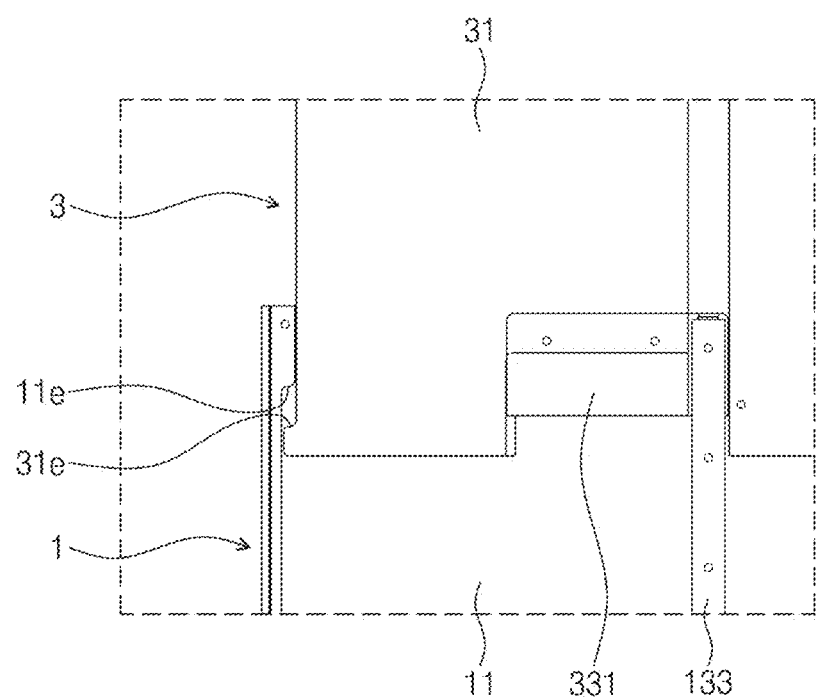
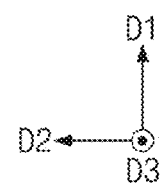

FIG. 19
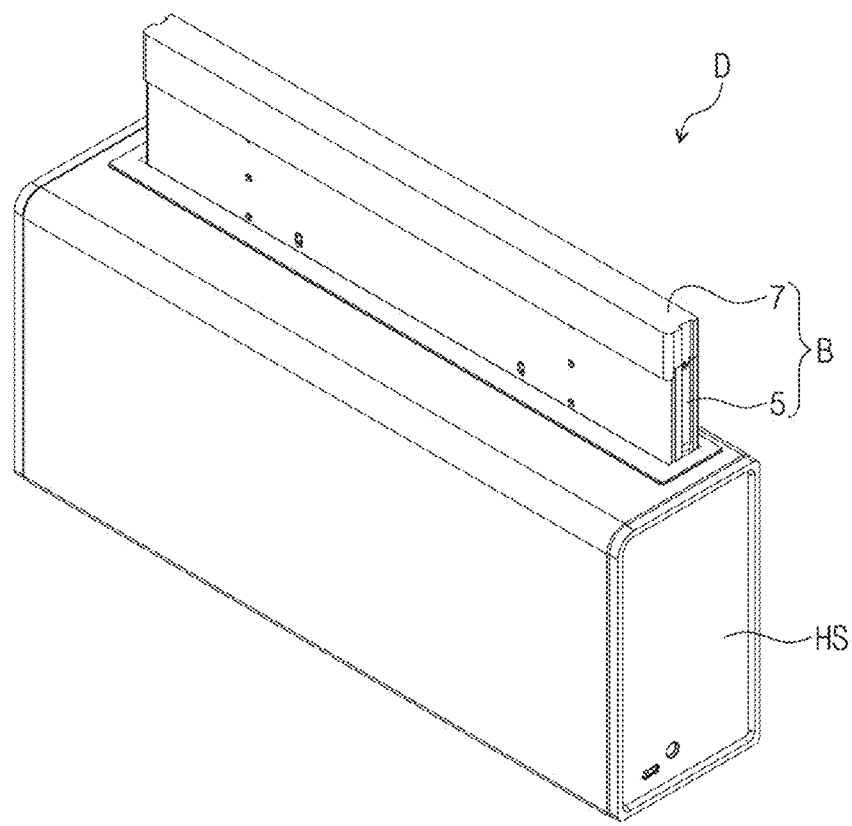
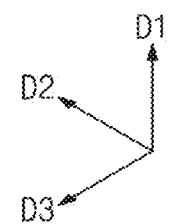

DISPLAY MODULE DRIVING DEVICE, DISPLAY APPARATUS INCLUDING THE SAME, AND DISPLAY APPARATUS DRIVING METHOD USING THE SAME

This application claims priority to Korean Patent Application No. 10-2021-0177875, filed on Dec. 13, 2021, and all the benefits accruing therefrom under 35 U.S.C. § 119, the content of which in its entirety is herein incorporated by reference.

BACKGROUND

1. Field

Embodiments of the invention herein relate to a display module driving device, a display apparatus including the same, and a display apparatus driving method using the same.

2. Description of the Related Art

Electronic devices, such as a smart phone, a digital camera, a notebook computer, a navigation system, and a smart television, which provide an image to a user, include a display apparatus which displays an image. The display apparatus generates an image and provides the generated image to a user through a display screen.

Various types of display apparatuses are being developed due to the technical advancement of the display apparatuses. Various flexible display apparatuses, which may be transformed into curved, folded, or rolled shapes, are being developed, for example. The flexible display apparatuses may be easy to carry and may improve the convenience of a user.

The shapes of flexible display panels, which are used for flexible display apparatuses, may be variously transformed. A display panel may be connected to a roller and wound around or unwound from the roller, for example. In this case, a structure which winds and unwinds the display panel is desired.

SUMMARY

Embodiments of the invention provide a display module driving device capable of winding and unwinding a display module, a display apparatus including the same, and a display apparatus driving method using the same.

An embodiment of the invention provides a display apparatus including a display module, a rolling cylinder which the display module is wound on and unwound from, and a lifting block unit disposed on a rear surface of the display module. The lifting block unit includes a first block portion, a second block portion coupled to the first block portion and movable up and down with respect to the first block portion, and a third block portion connected to an upper portion of the display module and coupled to the second block portion and movable up and down with respect to the second block portion. The second block portion is inserted into a first accommodation space defined in an upper portion of the first block portion and a second accommodation space defined in a lower portion of the third block portion.

In an embodiment of the invention, a display module driving device may include a fixed block unit, a rolling cylinder which is disposed in front of the fixed block unit and winds and unwinds a display module, and a lifting block unit. The lifting block unit includes a first block portion coupled to the fixed block unit and movable up and down with respect to the fixed block unit and a second block portion coupled to the first block portion and movable up and down with respect to the first block portion. The first block portion includes a first block body including an upper side in which a first accommodation space is defined and a lower driving part coupled to the first block body. The second block portion includes a second block body, which is inserted into the first accommodation space, and a corresponding lower driving part which is coupled to the second block body, engaged with the lower driving part and moves the second block body up and down.

In an embodiment of the invention, a method of driving a display apparatus may include moving a lifting block unit moves up from a fixed block unit, and moving a portion of the lifting block unit up after moving the lifting block unit. The lifting block unit may include a first block portion which is coupled to the fixed block unit and includes an upper side in which a first accommodation space is defined, a second block portion coupled to the first block portion, and a third block portion which is coupled to the second block portion and includes a lower side in which a second accommodation space is defined, in the moving the lifting block unit, the second block portion is inserted into the first accommodation space and the second accommodation space, and in the moving the portion of the lifting block unit, the second block portion partially inserted into the second accommodation space may be exposed since the third block portion moves up based on the second block portion.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings:

FIGS. 4 and 5 illustrate the display module and a lifting block unit which are exposed to the outside of the housing illustrated in FIG. 1;

FIG. 8 is a plan view of the display panel illustrated in FIG. 6;

FIG. 13 is an exploded perspective view illustrating an embodiment of only a portion of the display apparatus according to the invention in order to describe the relationship between a driving part and a corresponding driving part;

FIG. 14 is an exploded perspective view illustrating an embodiment of only a portion of the display apparatus according to the invention in order to describe the relationship between a guide bar and a guide block;

FIG. 16 is an enlarged front view for describing an embodiment of the relationship between two block portions of the display apparatus according to the invention;

FIGS. 19 to 21 are perspective views sequentially illustrating a method of driving the display apparatus according to the flowchart of FIG. 18;

DETAILED DESCRIPTION

Figure 1:
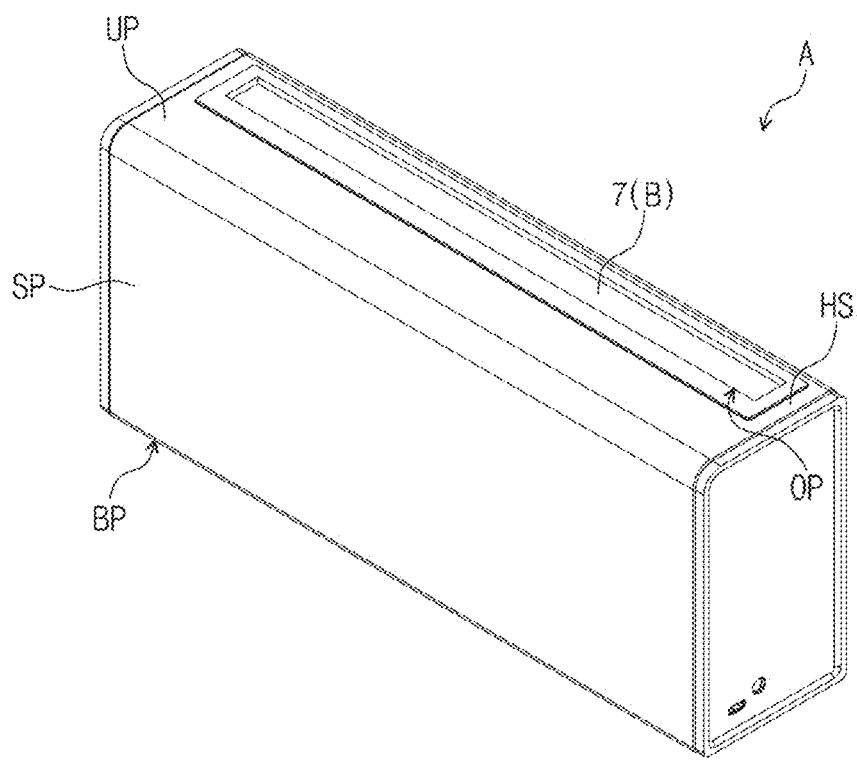
FIG. 1 is a perspective view illustrating an embodiment of a display apparatus according to the invention.

In this specification, it will be understood that when an element (or region, layer, portion, etc.) is referred to as being "on", "connected to" or "coupled to" another element, it can be directly on, connected or coupled to the other element, or intervening elements may be present.

Like reference numerals refer to like elements throughout. In addition, in the drawings, the thicknesses, ratios, and dimensions of elements are exaggerated for effective description of the technical contents. As used herein, the term "and/or" includes any and all combinations that the associated configurations can define.

It will be understood that, although the terms first, second, etc. may be used herein to describe various elements, these elements should not be limited by these terms. These terms are only used to distinguish one element from another element. For example, a first element could be termed a second element without departing from the scope of the invention. Similarly, the second element may also be referred to as the first element. The terms of a singular form include plural forms unless otherwise specified.

In addition, terms, such as "under", "lower", "above", "upper" or the like, are used herein for ease of description to describe one element's relation to another element(s) as illustrated in the drawing figures. The above terms are relative concepts and are described based on the directions indicated in the drawings.

It will be understood that the terms "include" and/or "have", when used in this specification, specify the presence of stated features, integers, steps, operations, elements, components and/or combinations thereof, but do not preclude the presence or addition of one or more other features, integers, steps, operations, elements, components, and/or combinations thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display apparatus and a light-emitting element in embodiments of the invention will be described with reference to the accompanying drawings.

FIG. 1 is a perspective view illustrating an embodiment of a display apparatus according to the invention.

Figure 2:
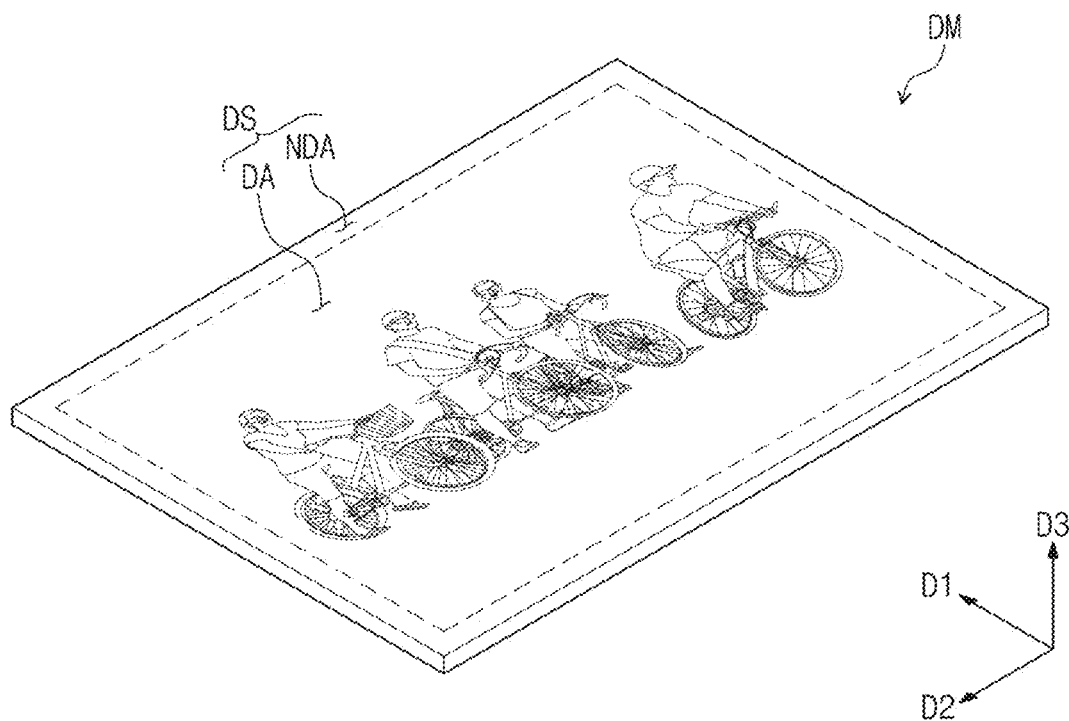
FIG. 2 illustrates a display module which is accommodated in a housing illustrated in FIG. 1.

FIG. 2 illustrates a display module which is accommodated in a housing illustrated in FIG. 1.

Hereinafter, a direction D1 in FIGS. 1 to 24 may be referred to as a first direction, a direction D2 crossing the first direction D1 may be referred to as a second direction, and a direction D3 crossing each of the first direction D1 and the second direction D2 may be referred to as a third direction. The first direction D1 may be also referred to as an upward direction, and a direction opposite to the first direction D1 may be also referred to as a downward direction. In addition, the third direction D3 may be also referred to as a front direction, and a direction opposite to the third direction D3 may be also referred to as a rear direction.

Referring to FIGS. 1 and 2, the display apparatus A may include a housing HS, a lifting block unit B, and a display modulae DM.

An opening OP opened toward the first direction D1 may be defined in the housing HS. The housing HS may extend longer in the second direction D2 than in the first direction D1.

A portion of the lifting block unit B may be disposed in the opening OP. The lifting block unit B may move up and down. The lifting block unit B may support the display module DM.

The housing HS may include a bottom surface portion BP, an upper surface portion UP, and sidewall portions SP. An opening OP defined in the upper surface portion UP. The bottom surface portion BP and the upper surface portion UP may have a plane defined by the second direction D2 and the third direction D3. The bottom surface portion BP and the upper surface portion UP may face each other in the first direction D1. The sidewall portions SP may extend from the edge of the bottom surface portion BP to the edge of the upper surface portion UP.

The display module DM may be accommodated in the housing HS. The display module DM may have a plane defined by the first direction D1 and the second direction D2. The display module DM may have a quadrangular (e.g., rectangular) shape having short sides extending in the first direction D1 and long sides extending in the second direction D2. However, the invention is not limited thereto, and the display module DM may have various shapes, such as a circular shape or a polygonal shape.

The front surface of the display module DM may be defined as a display surface DS and have a plane defined by the first direction D1 and the second direction D2. An image generated by the display module DM may be provided to a user through the display surface DS.

The display surface DS may include a display region DA and a non-display region NDA around the display region DA. The display region DA may display an image, and the non-display region NDA may not display an image. The non-display region NDA may surround the display region DA and define an edge of the display module DM printed in a predetermined color.

Although not illustrated, function buttons may be disposed on the housing. The function buttons may provide various functions to the display apparatus A. In an embodiment, the display module DM may move out of or move into the housing HS by operating the function buttons, for example. In addition, the brightness and resolution of an image, which is displayed on the display module DM, may be controlled by operating the function buttons.

Figure 3:
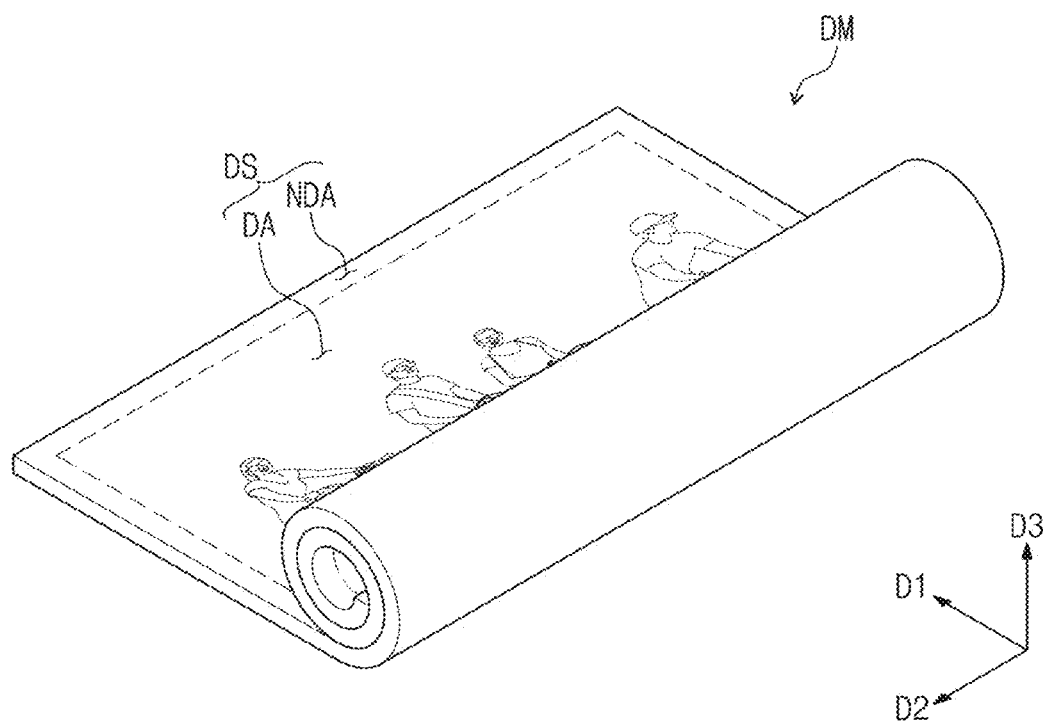
FIG. 3 illustrates a rolled state of the display module illustrated in FIG. 2.

FIG. 3 illustrates a rolled state of the display module illustrated in FIG. 2.

Referring to FIG. 3, the display module DM may be a flexible display module. The display module DM may be rolled like a scroll. The display module DM may be rolled in the first direction D1. The display module DM may be rolled from one side of the display module DM. The display module DM may be rolled so that the display surface DS thereof faces inside.

Figure 5:
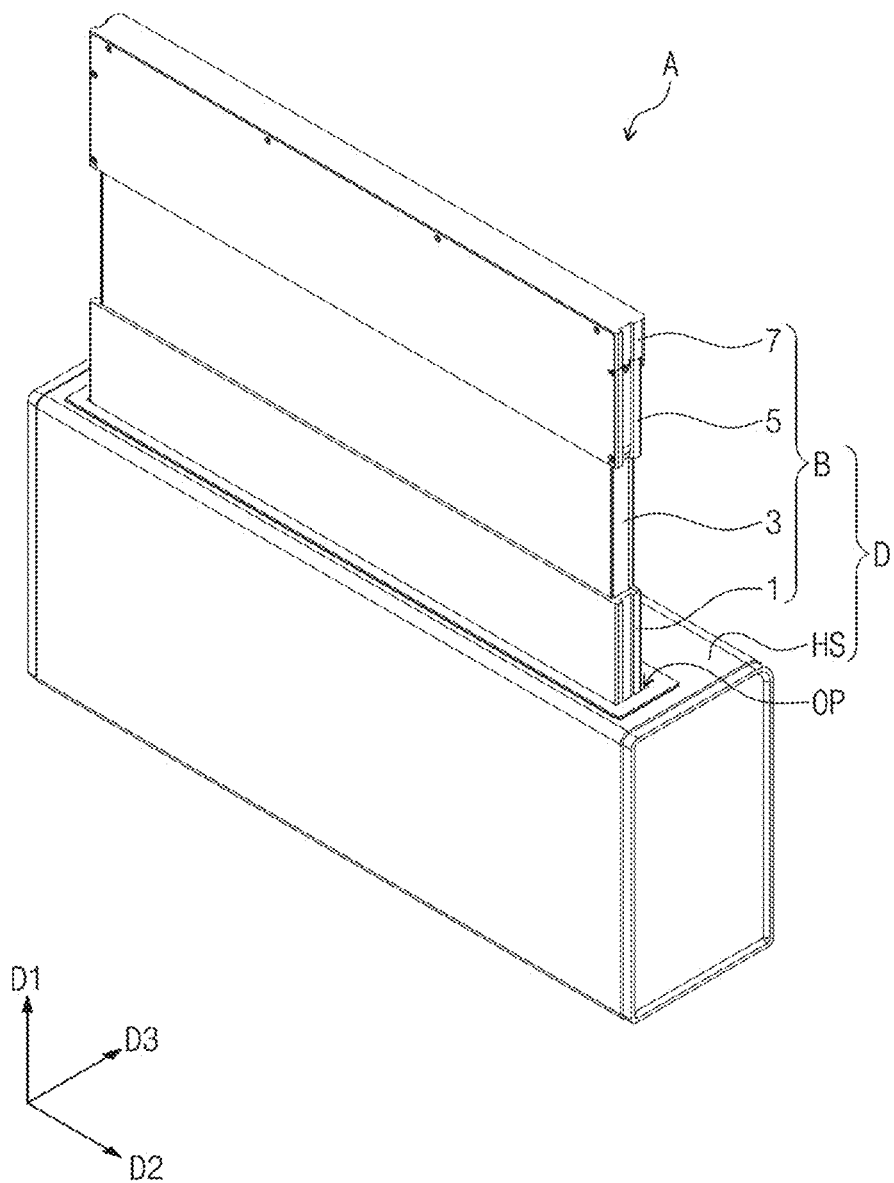

FIGS. 4 and 5 illustrate the display module and a lifting block unit which are exposed to the outside of the housing illustrated in FIG. 1.

Referring to FIGS. 4 and 5, the lifting block unit B of the display apparatus A may support the display module DM. More specifically, the lifting block unit B may be coupled to the upper end of the display module DM and support the rear surface BS of the display module DM from the back of the display module DM. The upper end of the display module DM may be fixed to the lifting block unit B and the front surface FS of the display module DM may be exposed to the outside. The lifting block unit B may be movable up and down with respect to the housing HS. When the lifting block unit B moves up, the display module DM having the upper end fixed to the lifting block unit B may also move up. On the contrary to this, when the lifting block unit B moves down, the display module DM may also move down. The lifting block unit B may include a plurality of block portions and/or a supporting portion. In an embodiment, the lifting block unit B may include a first block portion 1, a second block portion 3, a third block portion 5, and a supporting portion 7, for example.

The first block portion 1 may be movable up and down with respect to the housing HS. More specifically, the first block portion 1 may be coupled to a fixed block unit 9 (refer to FIG. 10) so as to be movable up and down. The second block portion 3 may be coupled to the first block portion 1 so as to be movable up and down with respect to the first block portion 1. The third block portion 5 may be coupled to the second block portion 3 so as to be movable up and down with respect to the second block portion 3. The supporting portion 7 may be coupled to the upper end of the third block portion 5. A coupling method between the block portions, which makes it possible for the block portions to move up and down, may be provided in various forms. A detailed description on this will be provided later.

Hereinafter, a device including the lifting block unit B, the housing HS, and components (to be described in detail later) inside the housing HS may be also referred to as a display module driving device D. That is, the display apparatus A may include the display module DM and the display module driving device D. The display module driving device D may be coupled to one side of the display module DM. The display module driving device D may move the display module DM up and down.

Figure 6:
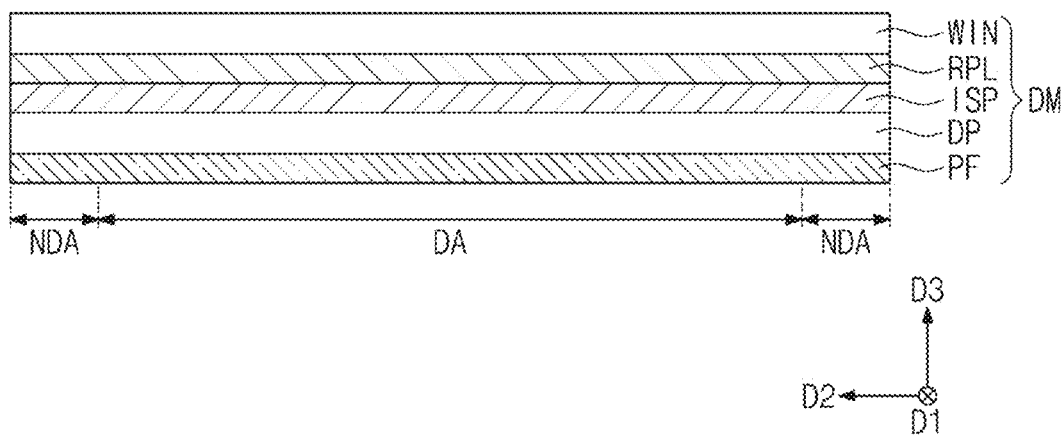
FIG. 6 illustrates a cross section of the display module illustrated in FIG. 2.

FIG. 6 illustrates a cross section of the display module illustrated in FIG. 2.

Referring to FIG. 6, the display module DM may include a display panel DP, an input sensing unit ISP, a reflection prevention layer RPL, a window WIN, and a panel protection film PF.

The display panel DP may be a flexible display panel. The display panel DP in an embodiment of the invention may be a light-emitting display panel, but the invention is not particularly limited. In an embodiment, the display panel DP may be an organic light-emitting display panel or an inorganic light-emitting display panel, for example. The light-emitting layer of the organic light-emitting display panel may include an organic light-emitting material. In an embodiment, the light-emitting layer of the inorganic light-emitting display panel may include a quantum dot, a quantum rod, or the like. Hereinafter, the display panel DP will be described as an organic light-emitting display panel.

The input sensing unit ISP may be disposed on the display panel DP. The input sensing unit ISP may include a plurality of sensors (not illustrated) which sense an external input in a capacitive method. When the display module DM is manufactured, the input sensing unit ISP may be manufactured directly on the display panel DP. However, the invention is not limited thereto, and the input sensing unit ISP may be manufactured as a panel independent of the display panel DP and then attached to the display panel DP by an adhesive layer.

The reflection prevention layer RPL may be disposed on the input sensing unit ISP. The reflection prevention layer RPL may be formed or disposed directly on the input sensing unit ISP or coupled to the input sensing unit ISP by an adhesive layer. The reflection prevention layer RPL may be defined as an external light reflection prevention film. The reflection prevention layer RPL may reduce the reflectance of external light incident toward the display panel DP from above the display apparatus A.

When external light travelling toward the display panel DP is reflected from the display panel DP like a mirror and provided to an external user again, the user may visually recognize the external light. In order to prevent such a phenomenon, in an embodiment, the reflection prevention layer RPL may include a plurality of color filters that display the same colors as those of the pixels of the display panel DP.

The color filters may filter external light so as to display the same colors as those of the pixels. In this case, the external light may not be visually recognized by the user. However, the invention is not limited thereto, and the reflection prevention layer RPL may include a polarizing film which reduces the reflectance of the external light. The polarizing film may include a retarder and/or a polarizer.

The window WIN may be disposed on the reflection prevention layer RPL. The window WIN may be formed or disposed directly on the reflection prevention layer RPL or may be coupled to the reflection prevention layer RPL by an adhesive layer. The window WIN may protect the display panel DP, the input sensing unit ISP, and the reflection prevention layer RPL from external scratches and impacts.

The panel protection film PF may be disposed under the display panel DP. The panel protection film PF may be formed or disposed directly under the display panel DP or may be coupled to the display panel DP by an adhesive layer. The panel protection film PF may protect the lower portion of the display panel DP. In an embodiment, the panel protection film PF may include a flexible plastic material such as polyethylene terephthalate ("PET").

Figure 7:
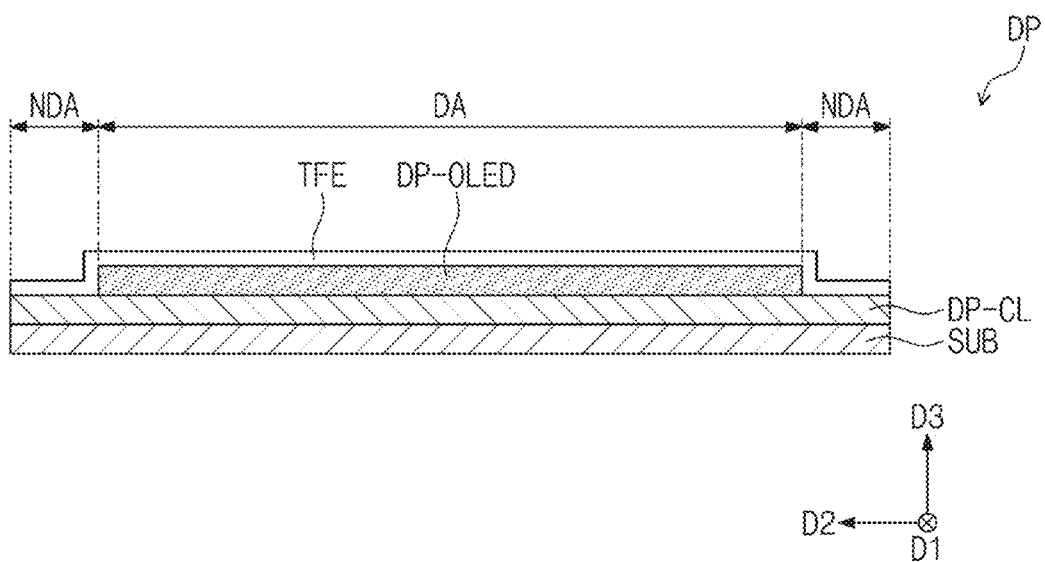
FIG. 7 illustrates a cross section of the display panel illustrated in FIG. 6.

FIG. 7 illustrates a cross section of the display panel illustrated in FIG. 6.

Referring to FIG. 7, the display panel DP includes a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display region DA and a non-display region NDA around the display region DA. In an embodiment, the substrate SUB may include a flexible plastic material such as polyimide ("PI"). The display element layer DP-OLED may be disposed in the display region DA.

A plurality of pixels may be disposed in the display region DA. Each of the pixels may include a light-emitting element, which is disposed in the display element layer DP-OLED and connected to a transistor disposed in the circuit element layer DP-CL.

The thin film encapsulation layer TFE may be disposed above the circuit element layer DP-CL so as to cover the display element layer DP-OLED. The thin film encapsulation layer TFE may include inorganic layers and an organic layer between the inorganic layers. The inorganic layers may protect the pixels from moisture/oxygen. The organic layer may protect the pixels from foreign substances such as dust particles.

FIG. 8 is a plan view of the display panel illustrated in FIG. 6.

Referring to FIG. 8, the display apparatus A may include a display panel DP, a scan driver SDV, a plurality of data drivers DDV, a plurality of flexible printed circuit boards FPCB, a plurality of printed circuit boards PCB, and a light-emitting driver EDV.

The display panel DP may include a display region DA and a non-display region NDA surrounding the display region DA. The display panel DP may have a quadrangular (e.g., rectangular) shape having long sides extending in the second direction D2 and short sides extending in the first direction D1, but the shape of the display panel DP is not limited thereto.

The display panel DP may include a plurality of pixels PX, a plurality of scan lines SL1 to SLm, a plurality of data lines DL1 to DLn, and a plurality of light-emitting lines EL1 to ELm. Her, 'm' and 'n' are natural numbers.

The pixels PX may be disposed in the display region DA. The scan driver SDV and the light-emitting driver EDV may be respectively disposed in the non-display region NDA adjacent to the short sides of the display panel DP.

The data drivers DDV may be disposed adjacent to the upper side of the display panel DP defined as one of the long sides of the display panel DP. The printed circuit hoards PCB may be disposed adjacent to the upper side of the display panel DP. The flexible printed circuit boards FPCB may be connected to the upper side of the display panel DP and the printed circuit boards PCB. The data drivers DDV may be manufactured in the form of an integrated circuit ("IC") chip and respectively disposed (e.g., mounted) on the flexible printed circuit boards FPCB.

The scan lines SL1 to SLm may extend in the second direction D2 to be connected to the pixels PX and the scan driver SDV. The light-emitting lines EL1 to ELm may extend in the second direction D2 to be connected to the pixels PX and the light-emitting driver EDV.

The data lines DL1 to DLn may extend in the first direction D1 to be connected to the pixels PX and the data drivers DDV. In the illustrated embodiment, two data lines DL1 and DLn connected to the data drivers DDV disposed on the leftmost and rightmost sides are illustrated for convenience, but a plurality of data lines may be respectively connected to all of the data drivers DDV.

Although not illustrated, the display apparatus A may further include a timing controller which controls operations of the scan driver SDV, the data drivers DDV, and the light-emitting driver EDV. The timing controller may be manufactured in the form of an IC chip and disposed (e.g., mounted) on the printed circuit boards PCB. The timing controller may be connected to the data drivers DDV, the scan driver SDV, and the light-emitting driver EDV through the printed circuit boards PCB and the flexible printed circuit boards FPCB.

The scan driver SDV may generate a plurality of scan signals, and the scan signals may be applied to the pixels PX through the scan lines SL1 to SLm. The data drivers DDV may generate a plurality of data voltages, and the data voltages may be applied to the pixels PX through the data lines DL1 to DLn. The light-emitting driver EDV may generate a plurality of light-emitting signals, and the light-emitting signals may be applied to the pixels PX through the light-emitting lines EL1 to ELm.

The pixels PX may receive data voltages in response to scan signals. The pixels PX may display an image by emitting light having a luminance corresponding to the data voltages in response to the light-emitting signals. The light-emitting time of the pixels PX may be controlled by the light-emitting signals.

Figure 9A:
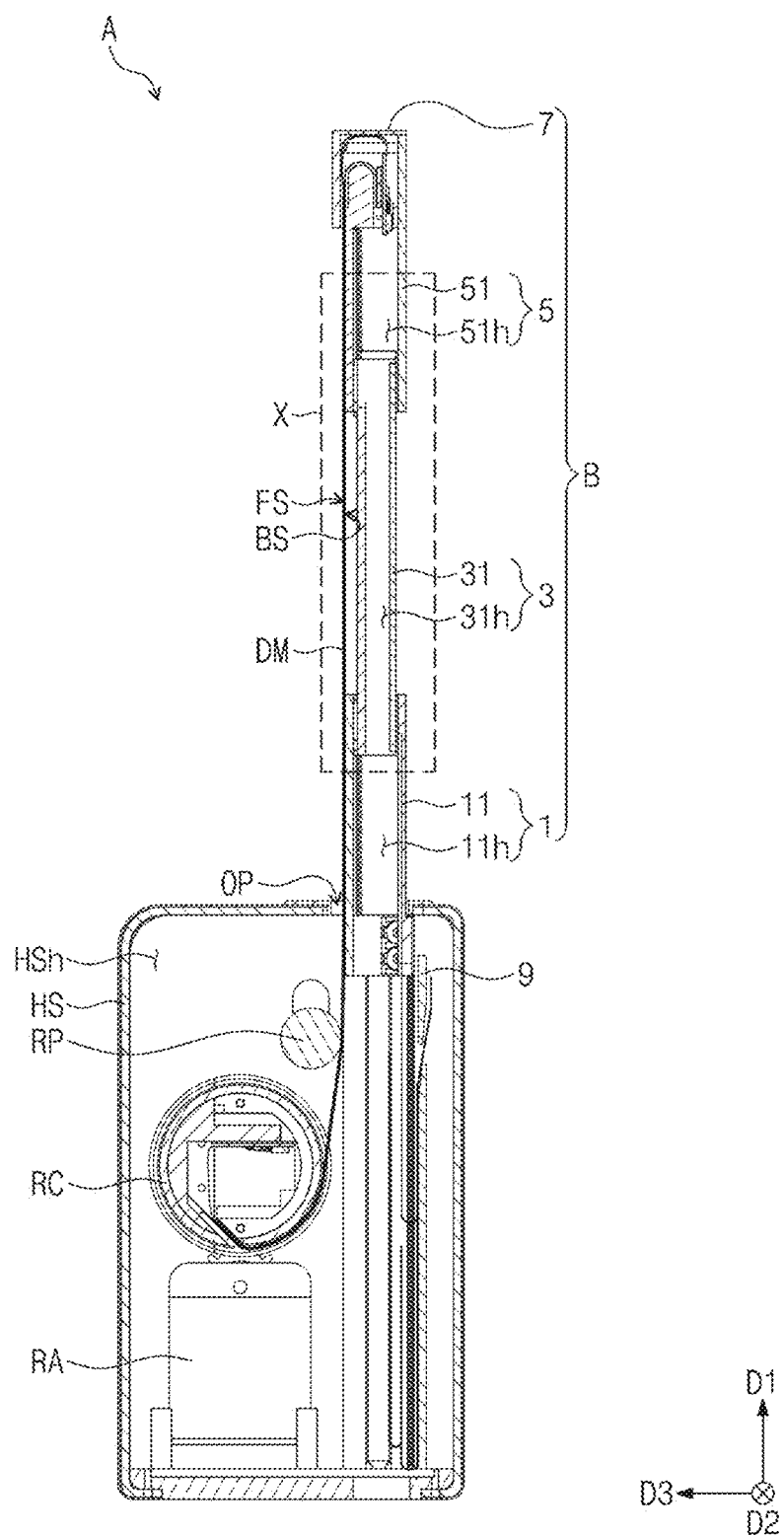
FIG. 9A is a side cross-sectional view illustrating an embodiment of the display apparatus according to the invention.

FIG. 9A is a side cross-sectional view illustrating an embodiment of the display apparatus according to the invention.

Referring to FIG. 9A, the display apparatus A may further include a rolling cylinder RC, a rolling driving unit RA, a module pressing unit RP, and a fixed block unit 9. Each of the rolling cylinder RC, the rolling driving unit RA, the module pressing unit RP, and the fixed block unit 9 may be disposed in the housing HS. That is, each of the rolling cylinder RC, the rolling driving unit RA, the module pressing unit RP, and the fixed block unit 9 may be disposed in an internal space HSh provided by the housing HS.

The rolling cylinder RC may have a cylindrical shape extending in the second direction D2. The rolling cylinder RC may fix one end of the display module DM. That is, the one end of the display module DM may be fixed to the rolling cylinder RC. When the rolling cylinder RC rotates about the second direction D2 as an axis, the display module DM may be wound around or unwound from the rolling cylinder RC.

The rolling driving unit RA may be connected to the rolling cylinder RC. The rolling driving unit RA may rotate the rolling cylinder RC about an axis parallel to the second direction D2. For this purpose, the rolling driving unit RA may include a structure such as a motor and a gear.

The module pressing unit RP may press the display module DM. In an embodiment, the module pressing unit RP may press the display module DM above the rolling cylinder RC, in a direction opposite to the third direction D3 and/or in a direction opposite to the first direction D1, for example. Accordingly, the display module DM unwound from the rolling cylinder RC may maintain tension so as to be in close contact with the lifting block unit B.

The fixed block unit 9 may be disposed behind the rolling cylinder RC and the rolling driving unit RA. The fixed block unit 9 may be fixed in the housing HS. The fixed block unit 9 may be coupled to the lifting block unit B. More specifically, the first block portion 1 may be coupled to the fixed block unit 9 in a vertically movable form. The fixed block unit 9 may support the lifting and lowering of the lifting block unit B.

Further details of the rolling cylinder RC, the rolling driving unit RA, the module pressing unit RP, and the fixed block unit 9 will be described in detail later with reference to FIG. 15.

The first block portion 1 may include a first block body 11. A first accommodation space 11$h$ may be defined in the first block body 11. More specifically, the first accommodation space 11$h$ may be defined in an upper portion of the first block body 11. The upper side of the first accommodation space 11$h$ may be open. That is, the first accommodation space 11$h$ may be a space defined in a portion of the upper surface of the first block body 11 and recessed downward. The back side of the first accommodation space 11$h$ is illustrated as being closed by the first block body 11, but the invention is not limited thereto. That is, both of the upper side and the back side of the first accommodation space 11$h$ may be open.

The third block portion 5 may include a third block body 51. A second accommodation space 51$h$ may be defined in the third block body 51. More specifically, the second accommodation space 51$h$ may be defined in a lower portion of the third block body 51. The lower side of the second accommodation space 51$h$ may be open. That is, the second accommodation space 51$h$ may be a space defined in a portion of the lower surface of the third block body 51 and recessed upward. The back side of the second accommodating space 51$h$ is illustrated as being closed by the third block body 51, but the invention is not limited thereto. That is, both of the lower side and the back side of the second accommodation space 51$h$ may be open.

The second block portion 3 may include a second block body 31. A block internal space 31$h$ may be defined in the second block body 31. At least a portion of the second block body 31 may be inserted into the first block body 11. More specifically, when the second block portion 3 moves down with respect to the first block portion 1, the lower portion of the second block body 31 may be disposed in the first accommodation space 11$h$. In an embodiment, about the lower half of the second block body 31 may be disposed in the first accommodation space 11$h$, for example.

In addition, at least a portion of the second block body 31 may be inserted into the third block body 51. More specifically, when the third block portion 5 moves down with respect to the second block portion 3, the upper portion of the second block body 31 may be disposed in the second accommodation space 51$h$. In an embodiment, about the upper half of the second block body 31 may be disposed in the second accommodation space 51$h$, for example.

In an embodiment of the invention, even in a state in which the second block portion 3 moves up with respect to the first block portion 1 and the second block portion 3 is exposed to the outside, a portion of the second block body 31 may be inserted in the first block body 11. In an embodiment, a lower portion of the second block body 31 may always be inserted in the first block body 11, for example. In addition, even in a state in which the third block portion 5 moves up with respect to the second block portion 3 and the second block portion 3 is exposed to the outside, a portion of the second block body 31 may be inserted in the third block body 51. In an embodiment, a portion of the upper side of the second block body 31 may always be inserted in the third block body 51, for example.

Figure 9B:
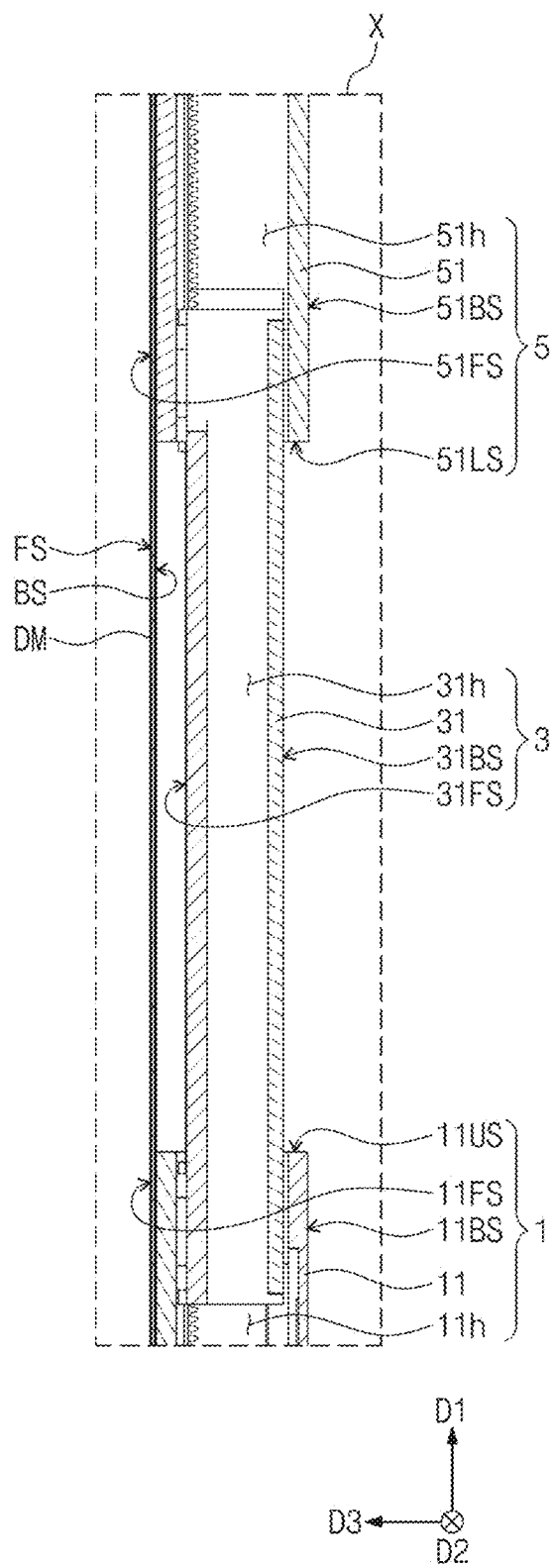
FIG. 9B is an enlarged side cross-sectional view illustrating region X of FIG. 9A.

FIG. 9B is an enlarged side cross-sectional view illustrating region X of FIG. 9A.

Referring to FIG. 9B, the lower surface 51LS of the third block body 51 may be disposed higher than the upper surface 11US of the first block body 11. The lower surface 51LS of the third block body 51 and the upper surface 11US of the first block body 11 may face each other. When the third block portion 5 moves down so that the second block body 31 is inserted into the second accommodation space 51$h$ and the second block portion 3 moves down so that the second block body 31 is inserted into the second accommodation space 51$h$, the lower surface 51LS of the third block body 51 and the upper surface 11US of the first block body 11 may become close to each other. In an embodiment, the lower surface 51LS of the third block body 51 and the upper surface 11US of the first block body 11 may come in contact with each other, for example. In this case, the second block body 31 may not be exposed to the outside.

The front surface 51FS of the third block body 51 may support the rear surface BS of the display module DM. That is, the front surface 51FS of the third block body 51 may come in contact with the rear surface BS of the display module DM. In an alternative embodiment, the front surface 11FS of the first block body 11 may support the rear surface BS of the display module DM. That is, the front surface 11FS of the first block body 11 may come in contact with the rear surface BS of the display module DM. In an embodiment of the invention, the front surface 51FS of the third block body 51 and the front surface 11FS of the first block body 11 may be substantially disposed in a same plane. In this case, both the front surface 51FS of the third block body 51 and the front surface 11FS of the first block body 11 may come in contact with the rear surface BS of the display module DM. Therefore, a support area for the rear surface BS of the display module DM may be increased. Accordingly, the display module DM may be stably supported, and damage to the display module DM may be prevented. In addition, in a state in which the lower surface 51LS of the third block body 51 and the upper surface 11US of the first block body 11 contact each other, the front surface 51FS of the third block body 51 and the front surface 11FS of the first block body 11 may form one continuous plane.

The rear surface 11BS of the first block body 11 and the rear surface 51BS of the third block body 51 may be substantially disposed in a same plane. Therefore, in a state in which the lower surface 51LS of the third block body 51 and the upper surface 11US of the first block body 11 contact each other, the rear surface 11BS of the first block body 11 and the rear surface 51BS of the third block body 51 may form one continuous plane.

The front surface 31FS of the second block body 31 may be disposed behind the front surface 51FS of the third block body 51. In addition, the rear surface 31BS of the second block body 31 may be disposed in front of the rear surface 51BS of the third block body 51.

Figure 10:
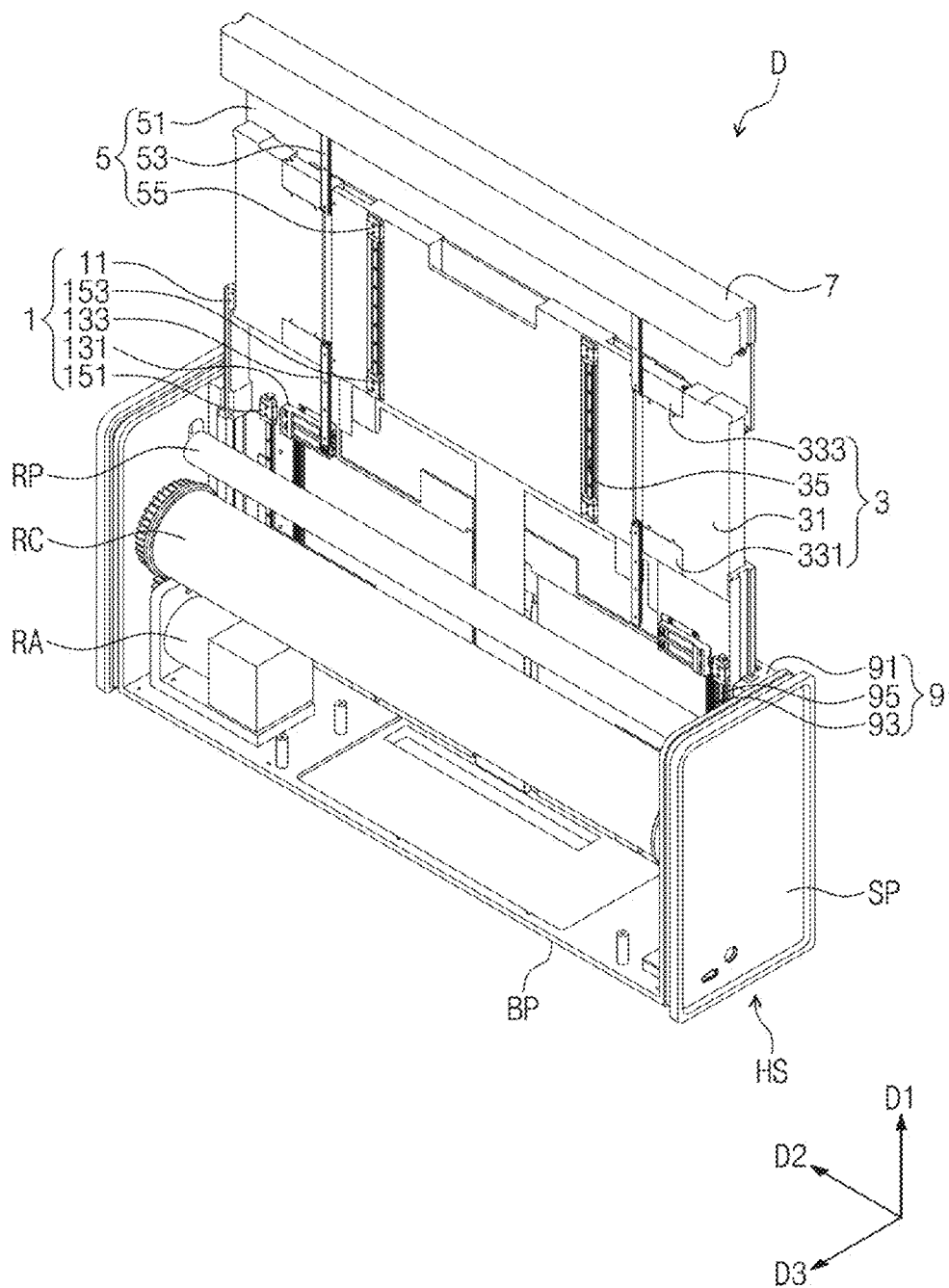
FIGS. 10 and 11 are exploded perspective views illustrating an embodiment of the display apparatus according to the invention.
Figure 11:
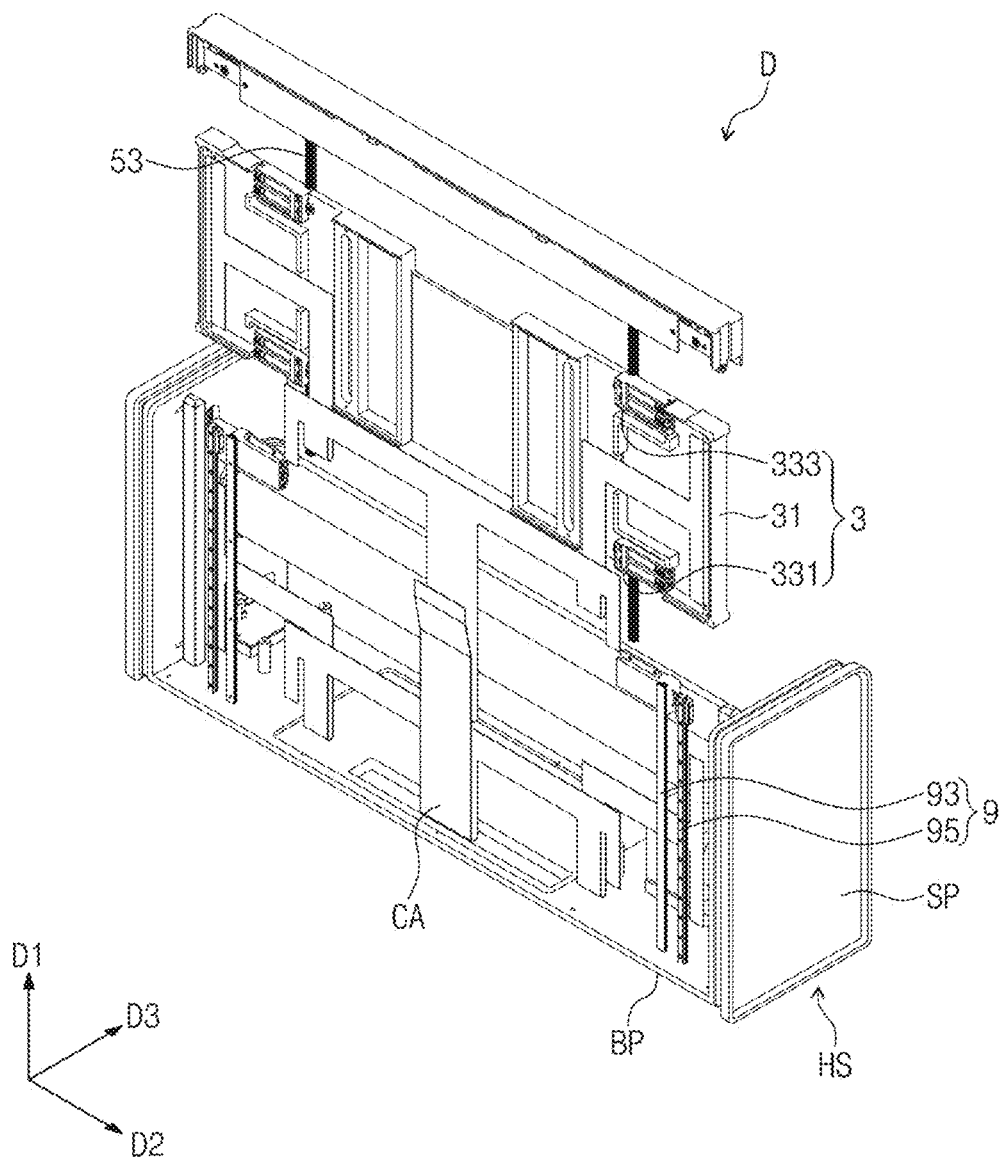

FIGS. 10 and 11 are exploded perspective views illustrating an embodiment of the display apparatus according to the invention.

In FIGS. 10 and 11, for the purpose of explaining internal components, the illustration of a portion of each component is omitted. In FIG. 10, the illustration of a portion of the front portion and the upper portion of the housing HS is omitted, for example. In addition, the illustration of a portion of the front portion of the first block body 11 is omitted, for example. The illustration of a portion of the front portion of the third block body 51 is also omitted, for example. In FIG. 11, the illustration of a portion of the rear portion of the fixed block unit 9 is omitted, for example. In addition, the illustration of portions of the rear portions of the first block portion 1, the second block portion 3, and the third block portion 5 is also omitted, for example.

Referring to FIGS. 10 and 11, the fixed block unit 9 may include a fixed block body 91, a base driving part 93, and a base guide bar 95.

The fixed block body 91 may be coupled to the housing HS. The fixed block body 91 may be fixed to the housing HS to support the lifting and lowering of the first block portion 1. A guide groove which guides the lifting and lowering of the first block portion 1 may be defined in the fixed block body 91. More details of this will be described in detail later with reference to FIG. 12.

The base driving part 93 may be coupled to the fixed block body 91. The base driving part 93 may be connected to a corresponding base driving part 131 (to be described in detail later) of the first block portion 1. The base driving part 93 may include a rack gear. More specifically, the base driving part 93 may be a rack gear, which extends vertically and is fixed to the fixed block body 91. This rack gear may be also referred to as a base rack gear. The base driving part 93 may be provided in plural. In an embodiment, two base driving parts 93 may be provided, for example. The two base driving parts 93 may be spaced apart from each other in the second direction D2. By the two base driving parts 93 spaced apart from side to side, a difference in movement speed between the left side and the right side of the first block portion 1 may be controlled when the first block portion 1 moves up and down. That is, when the first block portion 1 moves up and down, the left and right sides thereof may ascend and descend at the same speed. Accordingly, the display module DM may be prevented from being bent or deformed to one side while the display module DM moves up. Hereinafter, however, for the sake of convenience, the base driving part 93 will be described in a singular number. More details of this will be described in detail later with reference to FIGS. 12 and 13.

The base guide bar 95 may be coupled to the fixed block body 91. In an embodiment, the base guide bar 95 may have a bar shape, which extends vertically and is fixed to the fixed block body 91, for example. The base guide bar 95 may guide the lifting and lowering of the first block body 11. The base guide bar 95 may be provided in plural. In an embodiment, two base guide bars 95 may be provided, for example. The two base guide bars 95 may be spaced apart from each other in the second direction D2. Hereinafter, however, for the sake of convenience, the base guide bar 95 will be described in a singular number. More details of this will be described in detail later with reference to FIGS. 12 and 14.

The first block portion 1 may further include a corresponding base driving part 131, a lower driving part 133, a base guide block 151, and a lower guide block 153.

The corresponding base driving part 131 may be coupled to the first block body 11. In an embodiment, the corresponding base driving part 131 may be fixed to the lower side of the first block body 11, for example. The corresponding base driving part 131 may be connected to the base driving part 93. The corresponding base driving part 131 may include a motor. More specifically, the corresponding base driving part 131 may include a pinion gear engaged with the base driving part 93 and a motor connected thereto. This may be also referred to as a base gear motor assembly. When the corresponding base driving part 131 rides up or down the base driving part 93 in a state in which the corresponding base driving part 131 is engaged with the base driving part 93, the first block portion 1 may move up and down with respect to the fixed block body 91. The corresponding base driving part 131 may be provided in plural such that the number of base driving parts 131 correspond to the number of the base driving parts 93.

Although it is described above that the base driving part 93 is a rack gear and the corresponding base driving part 131 includes a pinion gear and a motor, the invention is not limited thereto. That is, the base driving part 93 may include a pinion gear and a motor, and the corresponding base driving part 131 may be a rack gear. In an alternative embodiment, the base driving part 93 and the corresponding base driving part 131 may include another mechanism by which the corresponding base driving part 131 may move up and down with respect to the base driving part 93 in a state in which the base driving part 93 and the corresponding base driving part 131 are connected to each other. More details of this will be described in detail later with reference to FIGS. 12 and 13.

The lower driving part 133 may be coupled to the first block body 11. The lower driving part 133 may be connected to a corresponding lower driving part 331 (to be described in detail later) of the second block portion 3. The lower driving part 133 may include a rack gear. More specifically, the lower driving part 133 may be a rack gear, which extends vertically and is fixed to the first block body 11. This may be also referred to as a lower rack gear. The lower driving part 133 may be provided in plural. In an embodiment, two lower driving parts 133 may be provided, for example. The two lower driving parts 133 may be spaced apart from each other in the second direction D2. The two lower driving parts 133 may be also referred to as a first lower driving part and a second lower driving part, respectively. That is, the first lower driving part and the second lower driving part may be spaced apart from each other in the horizontal direction. Hereinafter, however, for the sake of convenience, the lower driving part 133 will be described in a singular number.

The base guide block 151 may be fixedly coupled to the first block body 11. The base guide block 151 may be connected to the base guide bar 95. The base guide block 151 may ascend and descend along the extension direction of the base guide bar 95 when the first block portion 1 moves up and down. That is, the base guide block 151 may guide the lifting and lowering of the first block portion 1. The base guide block 151 may be provided in plural such that the number of base guide blocks 151 correspond to the number of the base guide bars 95. More details of this will be described with reference to FIGS. 12 and 14.

The lower guide block 153 may be fixedly coupled to the first block body 11. The lower guide block 153 may be connected to the guide bar 35 (to be described in detail later). The lower guide block 153 may ascend and descend along the extension direction of the guide bar 35 when the second block portion 3 moves up and down. That is, the lower guide block 153 may guide the lifting and lowering of the second block portion 3. The lower guide block 153 may be provided in plural such that the number of lower guide blocks 153 correspond to the number of the guide bars 35.

The second block portion 3 may further include a corresponding lower driving part 331, a corresponding upper driving part 333, and a guide bar 35.

The corresponding lower driving part 331 may be coupled to the second block body 31. In an embodiment, the corresponding lower driving part 331 may be fixed to the lower side of the second block body 31, for example. The corresponding lower driving part 331 may be connected to the lower driving part 133. The corresponding lower driving part 331 may include a configuration which is substantially the same as or similar to the configuration of the corresponding base driving part 131. This may be also referred to as a lower gear motor assembly. The relationship between the lower driving part 133 and the corresponding lower driving part 331 may be substantially the same as or similar to the relationship between the base driving part 93 and the corresponding base driving part 131. Therefore, when the corresponding lower driving part 331 rides up or down the lower driving part 133 in a state in which the corresponding lower driving part 331 is engaged with the lower driving part 133, the second block portion 3 may move up and down with respect to the first block body 11. The corresponding lower driving part 331 may be provided in plural such that the number of corresponding lower driving parts 331 correspond to the number of the lower driving parts 133. In an embodiment, when two lower driving parts 133 are provided, two corresponding lower driving parts 331 may also be provided, for example. The two corresponding lower driving parts 331 may be also referred to as a first corresponding lower driving part and a second corresponding lower driving part, respectively. That is, the first corresponding lower driving part and the second corresponding lower driving part may be engaged with the first lower driving part and the second lower driving part, respectively. Hereinafter, however, for the sake of convenience, the corresponding lower driving part 331 will be described in a singular number.

The corresponding upper driving part 333 may be coupled to the second block body 31. In an embodiment, the corresponding upper driving part 333 may be fixed to the upper side of the second block body 31, for example. The corresponding upper driving part 333 may be connected to an upper driving part 53 (to be described in detail later). The corresponding upper driving part 333 may include a configuration, which is substantially the same as or similar to that of the corresponding base driving part 131. This may be also referred to as an upper gear motor assembly. The relationship between the upper driving part 53 and the corresponding upper driving part 333 may be substantially the same as or similar to the relationship between the base driving part 93 and the corresponding base driving part 131. Therefore, when the corresponding upper driving part 333 rides up or down the upper driving part 53 in a state in which the corresponding upper driving part 333 is engaged with the upper driving part 53, the third block portion 5 moves up and down with respect to the second block body 31. The corresponding upper driving part 333 may be provided in plural such that the number of corresponding upper driving parts 333 correspond to the number of the upper driving parts 53.

The guide bar 35 may be coupled to the second block body 31. More specifically, the guide bar 35 may include a bar shape, which extends vertically and is fixed to the second block body 31. The shape of the guide bar 35 may be substantially the same as or similar to the shape of the base guide bar 95. The guide bar 35 may be connected to each of the lower guide block 153 and the upper guide block 55. The guide bar 35 may be provided in plural. In an embodiment, two guide bars 35 may be provided, for example. The two guide bars 35 may be spaced apart from each other in the second direction D2. Hereinafter, however, for the sake of convenience, the guide bar 35 will be described in a singular number.

The third block portion 5 may further include an upper driving part 53 and an upper guide block 55.

The upper driving part 53 may be coupled to the third block body 51. The upper driving part 53 may be connected to the corresponding upper driving part 333. The upper driving part 53 may include a rack gear. More specifically, the upper driving part 53 may be a rack gear, which extends vertically and is fixed to the third block body 51. This may be also referred to as an upper rack gear. The upper driving part 53 may be provided in plural. In an embodiment, two upper driving parts 53 may be provided, for example. The two upper driving parts 53 may be spaced apart from each other in the second direction D2. Hereinafter, however, for the sake of convenience, the upper driving part 53 will be described in a singular number.

The upper guide block 55 may be fixedly coupled to the third block body 51. The upper guide block 55 may be connected to the guide bar 35. The upper guide block 55 may ascend and descend along the extension direction of the guide bar 35 when the third block portion 5 moves up and down. That is, the upper guide block 55 may guide the lifting and lowering of the third block portion 5. The upper guide block 55 may be provided in plural such that the number of upper guide blocks 55 correspond to the number of the guide bars 35.

Figure 12:
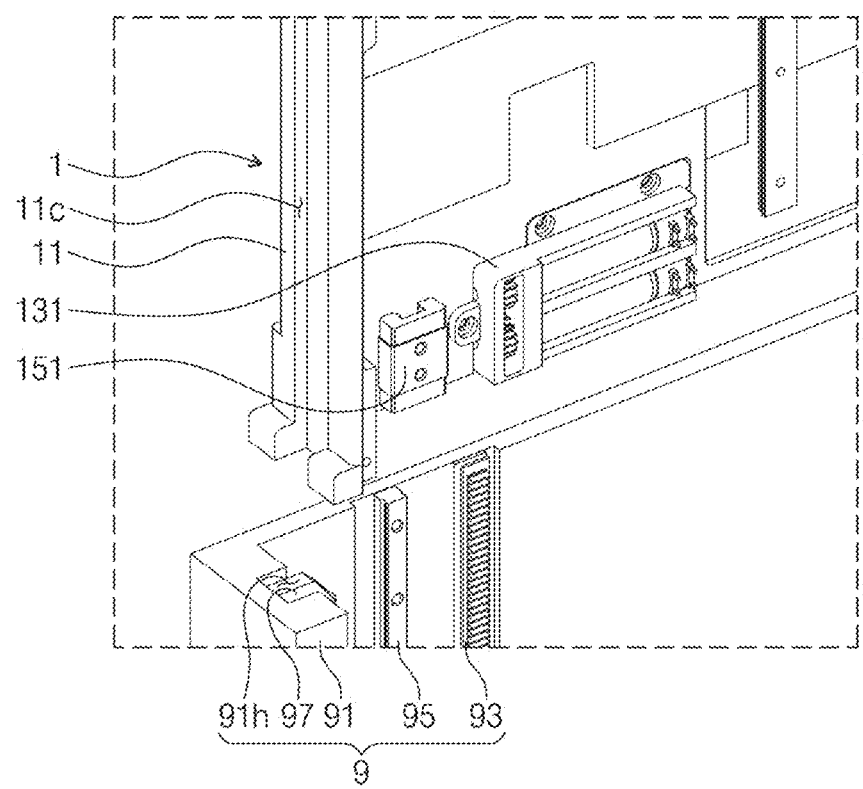
FIG. 12 is an enlarged exploded perspective view illustrating an embodiment of a portion of the display apparatus according to the invention in order to describe a driving part and a guide bar.

FIG. 12 is an enlarged exploded perspective view illustrating an embodiment of a portion of the display apparatus according to the invention in order to describe a driving part and a guide bar. FIG. 13 is an exploded perspective view illustrating an embodiment of only a portion of the display apparatus according to the invention in order to describe the relationship between a driving part and a corresponding driving part. FIG. 14 is an exploded perspective view illustrating an embodiment of only a portion of the display apparatus according to the invention in order to describe the relationship between a guide bar and a guide block.

Referring to FIG. 12, a first block insertion groove 11c may be defined in the first block body 11. The first block insertion groove 11c may be a groove recessed to a predetermined depth inward from the side surface of the first block body 11. The first block insertion groove 11c may extend vertically.

A fixed insertion groove 91h may be defined in the fixed block body 91. The fixed insertion groove 91h may be a groove recessed to a predetermined depth outward from the inner side surface of the fixed block body 91. The fixed insertion groove 91h may extend vertically.

The fixed block unit 9 may further include an insertion guide bar 97. The insertion guide bar 97 may have a bar shape which extends vertically. The insertion guide bar 97 may be inserted into the fixed insertion groove 91h. One side of the insertion guide bar 97 may be inserted into the fixed insertion groove 91h, and the other side of the insertion guide bar 97 may be inserted into the fixed insertion groove 91h. Accordingly, when the first block body 11 moves up and down with respect to the fixed block body 91, the moving direction of the first block body 11 may be guided.

Referring to FIGS. 13 and 12, the base driving part 93 may include a lower rack gear. The lower rack gear may include a gear bar 931 and a saw tooth structure 933.

The gear bar 931 may have a bar shape which extends vertically. One surface of the gear bar 931 may be coupled to one surface of the fixed block body 91. A housing insertion groove 931c may be defined in the gear bar 931. The housing insertion groove 931c may be defined by being recessed inward from the side surface of the gear bar 931. The housing insertion groove 931c may extend vertically. Two housing insertion grooves 931c may be provided. The two housing insertion grooves 931c may be opposite to each other with respect to the gear bar 931. Hereinafter, however, for the sake of convenience, the housing insertion groove 931c will be described in a singular number.

The saw tooth structure 933 may be formed or disposed on the other surface of the gear bar 931. The saw tooth structure 933 may be repeatedly disposed vertically along the other surface of the gear bar 931.

The corresponding base driving part 131 may include a motor 131m, a pinion gear 131g, and a motor housing 131H.

The motor 131m may be an actuator that converts power into rotational power. That is, the motor 131m may receive power from the outside and convert the power into rotational power. The motor 131m may rotate the pinion gear 131g. Two motors 131m may be provided. The two motors 131m may be disposed vertically. The two motors 131m may be also referred to as a first motor and a second motor, respectively. That is, the first motor and the second motor may be arranged above and below each other. Hereinafter, however, unless there is a special circumstance, for the sake of convenience, the motor 131m will be described in a singular number.

The pinion gear 131g may be coupled to the motor 131m. The pinion gear 131g may be engaged with the base driving part 93 (lower rack gear). More specifically, the pinion gear 131g may be engaged with the saw tooth structure 933. Accordingly, while rotating, the pinion gear 131g may ride up or down the base driving part 93. The pinion gear 131g may be provided in plural such that the number of pinion gears 131g correspond to the number of the motors 131m. In an embodiment, two pinion gears 131g may be provided, for example. By using the two motors 131m, the two pinion gears 131g may be engaged with one base driving part 93 (lower rack gear). Therefore, when the first block body 11 moves, the first block body 11 may be prevented from being temporarily pushed back. Accordingly, precise driving may be possible. The two pinion gears 131g may be also referred to as a first pinion gear and a second pinion gear, respectively. That is, the first pinion gear and the second pinion gear may be coupled to the first motor and the second motor, respectively.

The motor housing 131H may surround the motor 131m. The motor housing 131H may be coupled to the first block body 11. Accordingly, the motor housing 131H may fix the motor 131m to the first block body 11. A gear bar insertion groove 131Hc may be defined in the motor housing 131H. The gear bar insertion groove 131Hc may vertically pass through the motor housing 131H. The gear bar 931 may be inserted into the gear bar insertion groove 131Hc. The motor housing 131H may further include a protruding structure 131Hp. The protruding structure 131Hp may refer to a structure protruding toward the insertion groove 131Hc from the inner surface of the insertion groove 131Hc. The protruding structure 131Hp may be inserted into the housing insertion groove 931c. When the protruding structure 131Hp is inserted into the housing insertion groove 931c, the gear bar 931 inserted into the gear bar insertion groove 131Hc may be prevented from being separated back and forth.

Although not illustrated, each of the lower driving part 133 and the upper driving part 53 described with reference to FIGS. 10 and 11 may include a configuration which is substantially the same as or similar to the configuration of the base driving part 93 described with reference to FIG. 12. In addition, each of the corresponding lower driving part 331 and the corresponding upper driving part 333 may include a configuration which is substantially the same as or similar to the configuration of the corresponding base driving part 131.

Referring to FIGS. 14 and 12, a guide insertion groove 95c may be defined in the base guide bar 95. The guide insertion groove 95c may be defined by being recessed inward from the side surface of the base guide bar 95. The guide insertion groove 95c may extend vertically. Two guide insertion grooves 95c may be provided. The two guide insertion grooves 95c may be opposite to each other with respect to the base guide bar 95. Hereinafter, however, for the sake of convenience, the guide insertion groove 95c will be described in a singular number.

A guide through hole 151c may be defined in the base guide block 151.

The guide through hole 151c may pass through the base guide block 151 vertically. The guide through hole 151c may be opened rearward. The base guide bar 95 may be inserted into the guide through hole 151c. The base guide block 151 may include a protruding guide structure 151p. The protruding guide structure 151p may refer to a structure protruding toward the guide through hole 151c from the inner surface of the guide through hole 151c. The protruding guide structure 151p may be inserted into the guide insertion groove 95c. When the protruding guide structure 151p is inserted into the guide insertion groove 95c, the base guide bar 95 inserted into the guide through hole 151c may be prevented from being separated back and forth.

Although not illustrated, the guide bar 35 described with reference to FIGS. 10 and 11 may include a configuration which is substantially the same as or similar to the configuration of the base guide bar 95 described with reference to FIG. 14. In addition, each of the lower guide block 153 and the upper guide block 55 may include a configuration which is substantially the same as or similar to the configuration of the base guide block 151.

Figure 15:
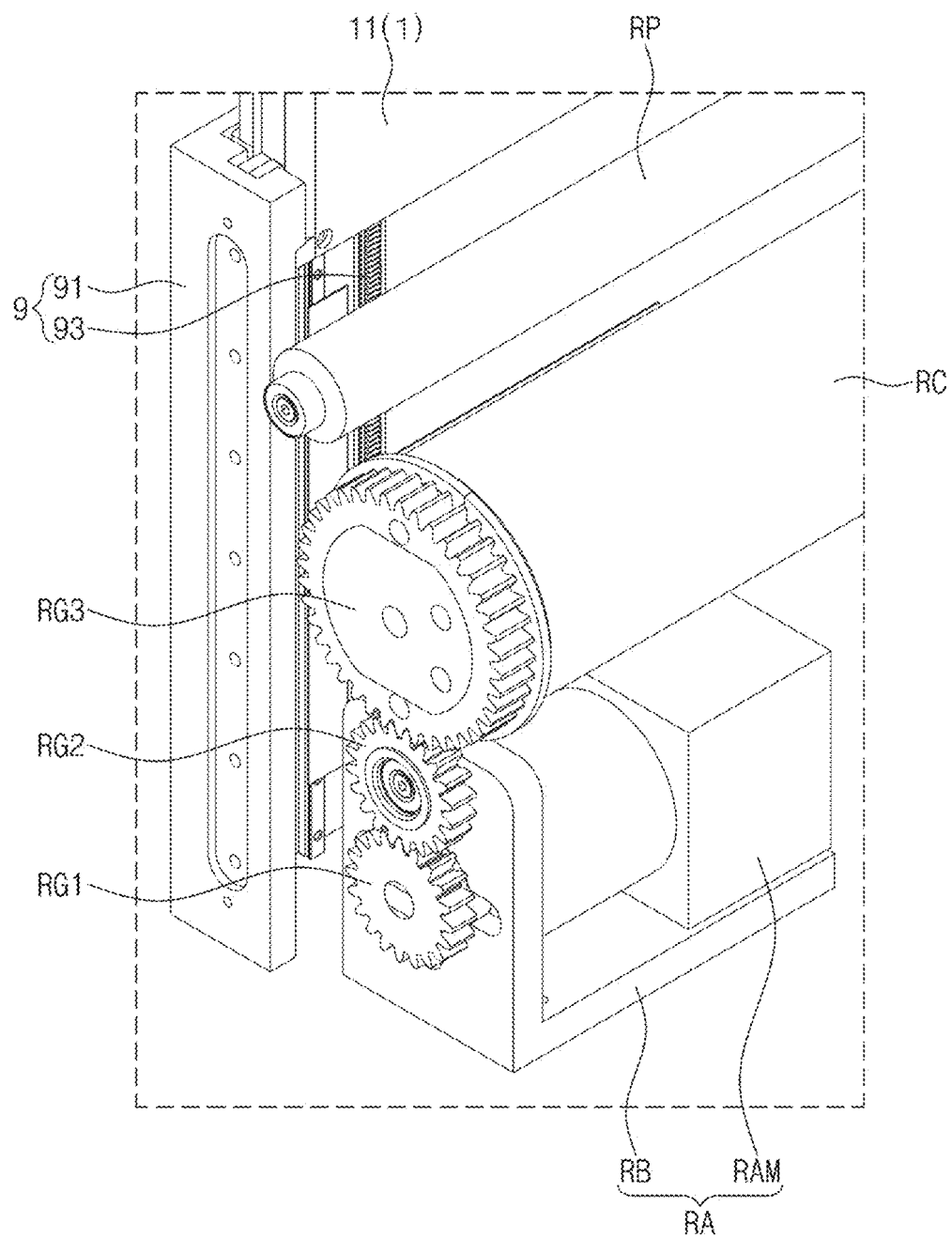
FIG. 15 is an enlarged exploded perspective view illustrating an embodiment of a portion of the display apparatus according to the invention in order to describe a rolling driving unit.

FIG. 15 is an enlarged exploded perspective view illustrating an embodiment of a portion of the display apparatus according to the invention in order to describe a rolling driving unit.

Referring to FIG. 15, the rolling driving unit RA may include a rolling motor RAM and a motor support part RB. The rolling motor RAM may receive power from the outside to produce rotational power. The rolling motor RAM may rotate the rolling cylinder RC. For this purpose, the rolling motor RAM may be connected to a rolling gear. The rolling motor RAM may transmit rotational power to the rolling cylinder RC through the rolling gear. In an embodiment, the rolling motor RAM may transmit rotational power to the rolling cylinder RC through a first rolling gear RG1, a second rolling gear RG2, and a third rolling gear RG3, for example. The motor support part RB may support the rolling motor RAM. The motor support part RB may fix the rolling motor RAM to the housing HS (refer to FIG. 10).

FIG. 16 is an enlarged front view for describing an embodiment of the relationship between two block portions of the display apparatus according to the invention.

Referring to FIG. 16, the first block body 11 may include a first trapping part 11e. In addition, the second block body 31 may include a second trapping part 31e. The first trapping part 11e may be disposed above the second trapping part 31e. When the second block portion 3 moves up, the maximum height of the second block portion 3 may be limited by contact between the first trapping part 11e and the second trapping part 31e. Therefore, the lifting height of the second block portion 3 may be controlled to a predetermined level. Accordingly, accurate driving may be implemented.

Figure 17:
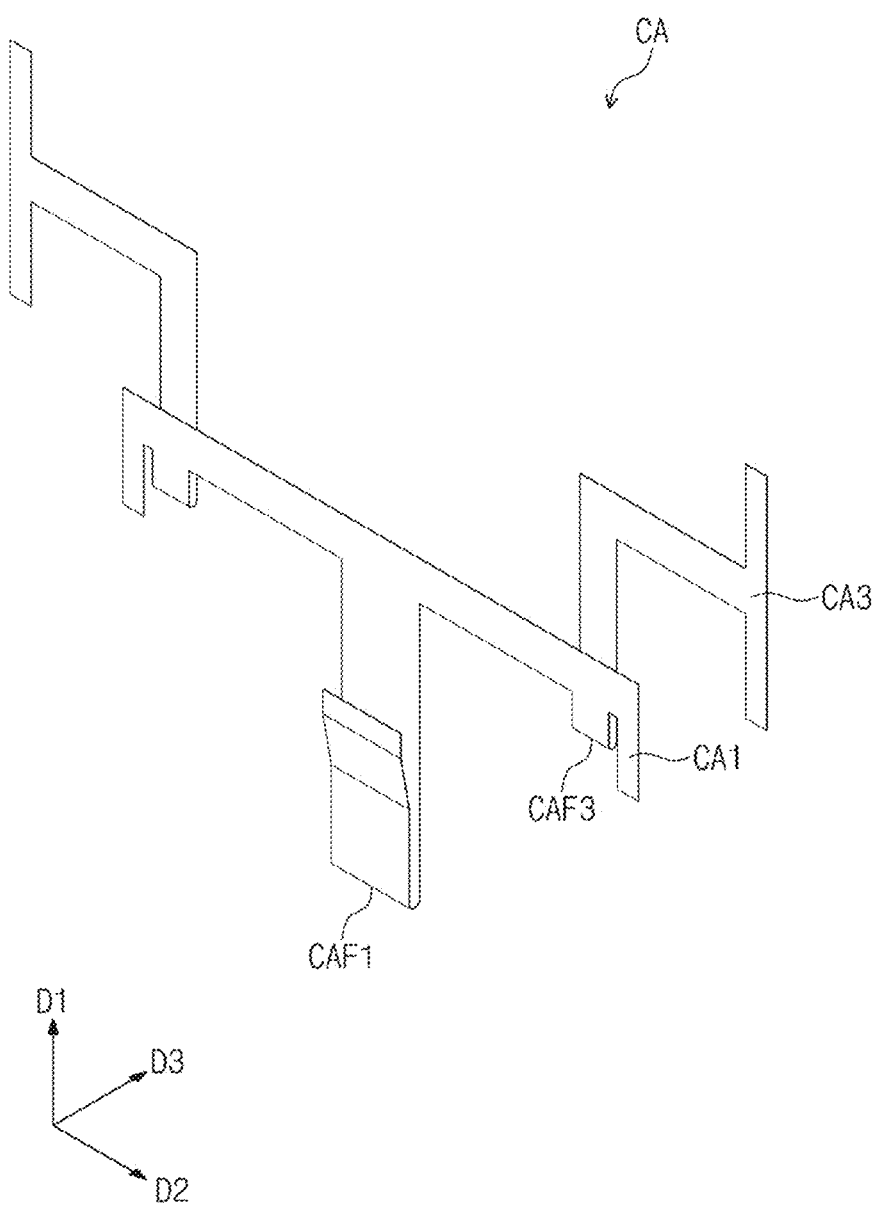
FIG. 17 is a perspective view illustrating an embodiment of a cable assembly of the display apparatus according to the invention.

FIG. 17 is a perspective view illustrating an embodiment of a cable assembly of the display apparatus according to the invention.

Referring to FIGS. 17 and 11, the display apparatus A may further include a cable assembly CA. The cable assembly CA may be a structure including a plurality of cables therein. The cable assembly CA may be inserted into the housing HS, the first block portion 1, the second block portion 3, and the third block portion 5. A portion of the cable assembly CA may be fixed to the housing HS, the first block portion 1, the second block portion 3, and/or the third block portion 5. In an embodiment, a first assembly CA1 may be fixed to the first block portion 1, for example. In addition, a second assembly CA3 may be fixed to the second block portion 3. The cable assembly CA may include a flexible material. Accordingly, when the first block portion 1, the second block portion 3, and the third block portion 5 move up or down, a portion of the cable assembly CA may be rolled or folded. In an embodiment, when the first block portion 1 moves down, a first deformable portion CAF1 may be rolled and folded, for example. In an alternative embodiment, when the second block portion 3 moves down, a second deformable portion CAF3 may be rolled and folded. By embedding a plurality of cables inside the cable assembly CA, wiring may be easily arranged. In addition, the cables may be prevented from being tangled or twisted with each other when the first block portion 1, the second block portion 3, and the third block portion 5 move.

Figure 18:
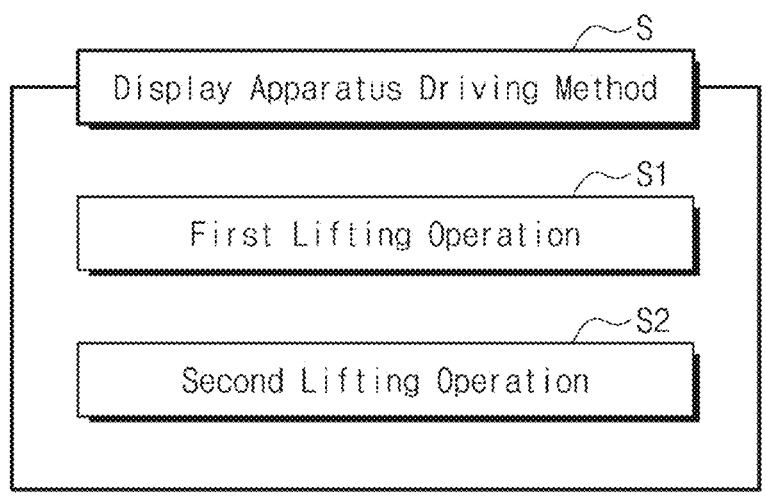
FIG. 18 is a flowchart showing an embodiment of a method of driving the display apparatus according to the invention.
Figure 20:
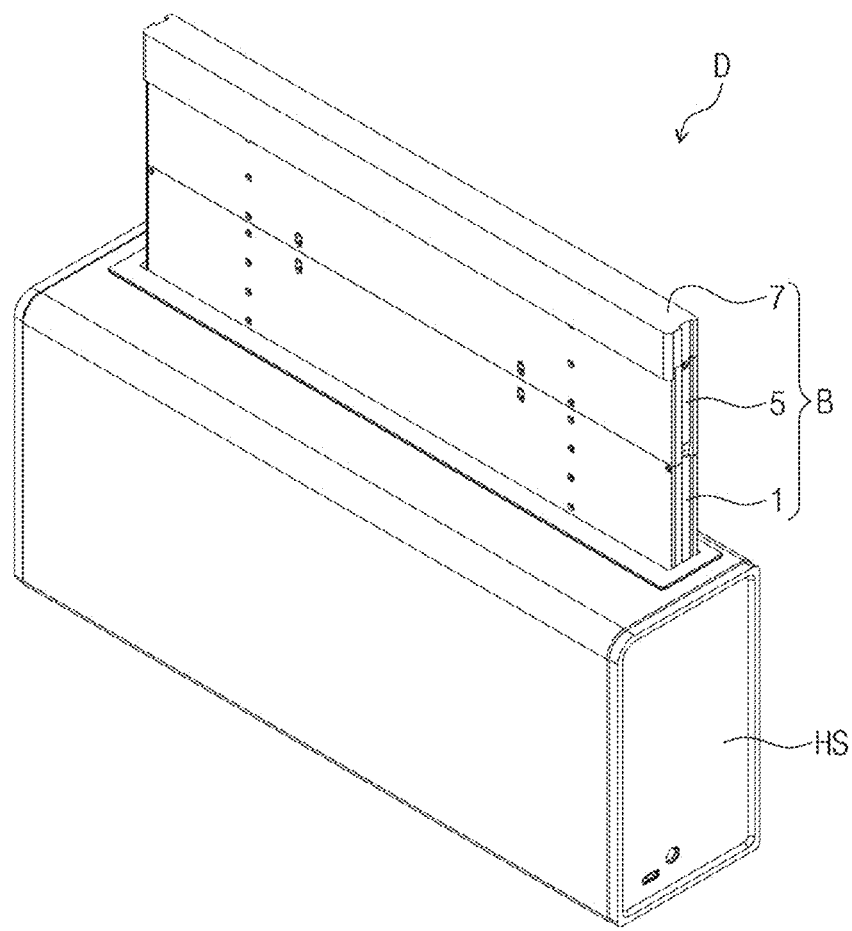
Figure 21:
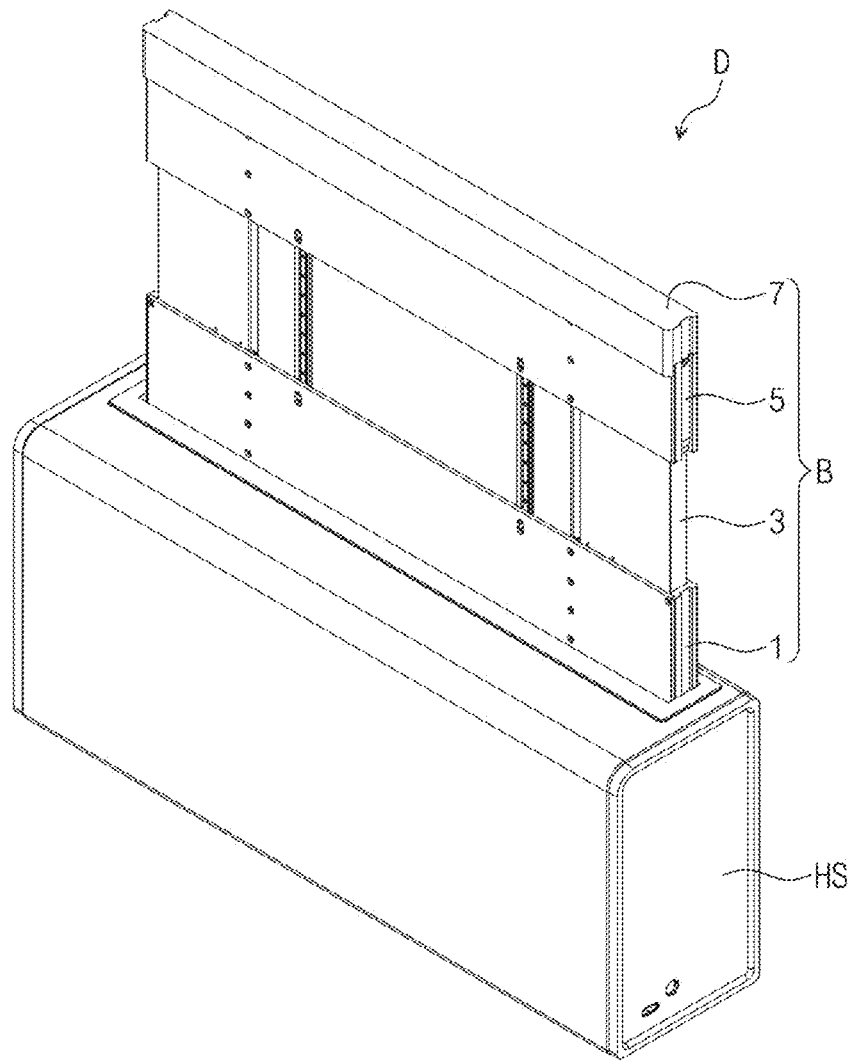

FIG. 18 is a flowchart showing an embodiment of a method of driving the display apparatus according to the invention, and FIGS. 19 to 21 are perspective views sequentially illustrating a method of driving the display apparatus according to the flowchart of FIG. 18.

In FIGS. 19 to 21, the display module DM (refer to FIG. 2) is omitted to show the movement of the lifting block unit B.

Referring to FIG. 18, a display apparatus driving method S may include a first lifting operation S1 and a second lifting operation S2.

Referring to FIGS. 19, 20 and 18, the first lifting operation S1 may include lifting the lifting block unit B from the fixed block unit 9 (refer to FIG. 10). The first lifting operation S1 may be performed by the base driving part 93 and the corresponding base driving part 131 which are described with reference to FIG. 10. In addition, in the first lifting operation S1, the rolling cylinder RC may be rotated by the rolling driving unit RA. Accordingly, a portion of the display module DM (refer to FIG. 2) wound around the rolling cylinder RC may be unwound. The unwound portion of the display module DM may move up along the lifting block unit B.

In the first lifting operation S1, the first block portion 1 may be exposed to the outside of the housing HS. The first lifting operation S1 may continue until the first block portion 1 is completely lifted. In the first lifting operation S1, the relative distances between the first block portion 1 and each of the second block portion 3 and the third block portion 5 may be constant. In addition, in the first lifting operation S1, the second block portion 3 may be inserted in the first accommodation space 11h (refer to FIG. 9A) and the second accommodation space 51h (refer to FIG. 9A). Therefore, in the first lifting operation S1, the second block portion 3 may not be exposed to the outside.

Referring to FIGS. 21 and 18, the second lifting operation S2 may include further lifting a portion of the lifting block unit B. More specifically, in the second lifting operation S2, the second block portion 3 may move up with respect to the first block portion 1, and the third block portion 5 may move up with respect to the second block portion 3. Accordingly, the second block portion 3 may come out of the first accommodation space 11h (refer to FIG. 9A) and the second accommodation space 51h (refer to FIG. 9A). In addition, the third block portion 5 may move away from the first block portion 1. The second block portion 3 may be exposed to the outside.

The second lifting operation S2 may be performed by the lower driving part 133, the corresponding lower driving part 331, the upper driving part 53, and the corresponding upper driving part 333 described with reference to FIG. 10. In addition, in the second lifting operation S2, the rolling cylinder RC may be rotated by the rolling driving unit RA. Accordingly, a portion of the display module DM (refer to FIG. 2) wound around the rolling cylinder RC may be unwound. The partially unwound display module DM may continue to move up along the lifting block B.

Figure 22:
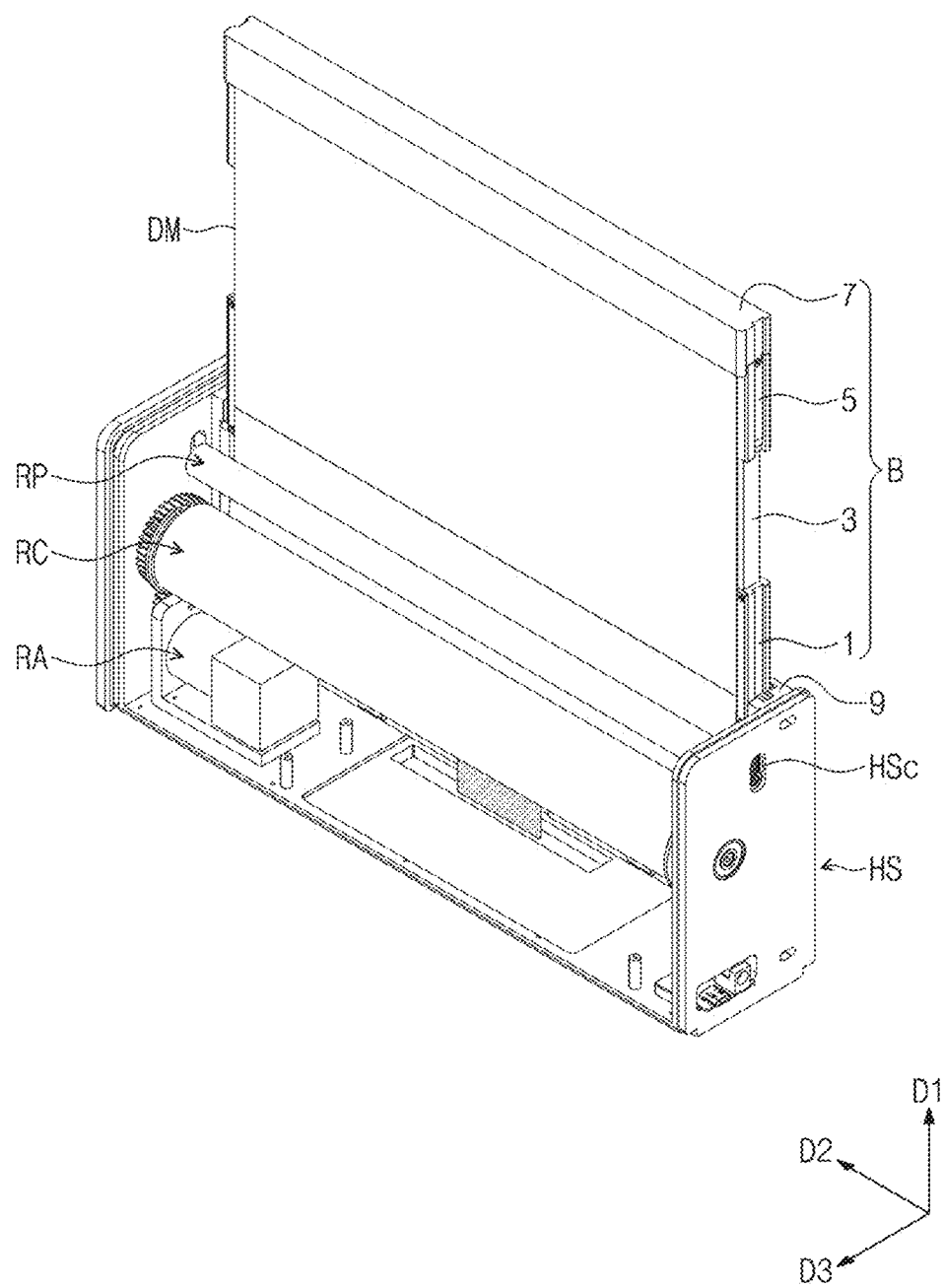
FIG. 22 is an exploded perspective view for describing an embodiment of a module pressing unit of the display apparatus according to the invention.
Figure 23:
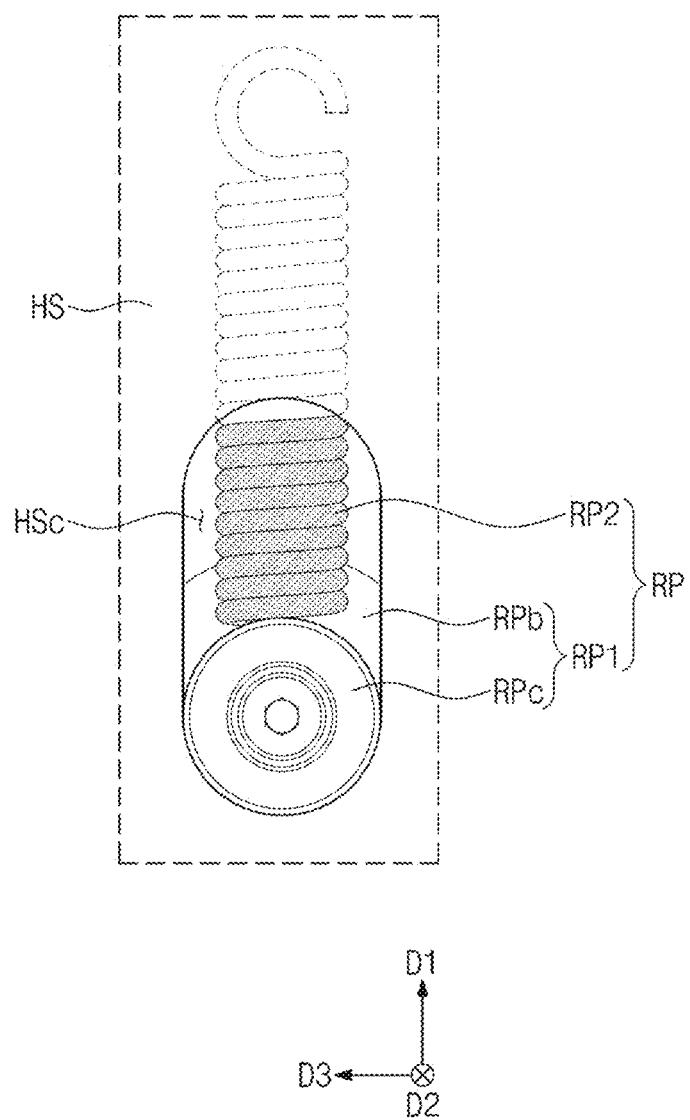
FIG. 23 is a side view for describing an embodiment of the module pressing unit of the display apparatus according to the invention.
Figure 24:
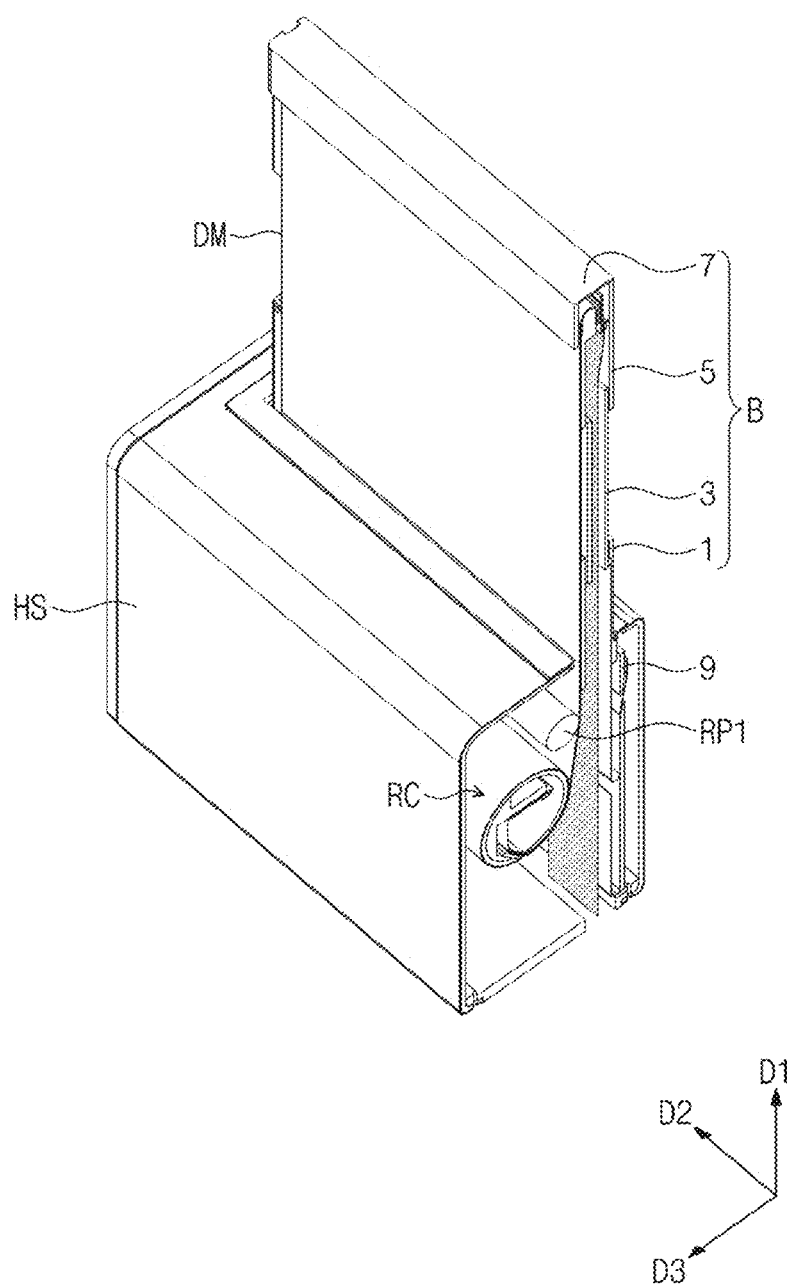
FIG. 24 is a cut-away perspective view for describing an embodiment of the module pressing unit of the display apparatus according to the invention.

FIG. 22 is an exploded perspective view for describing an embodiment of a module pressing unit of the display apparatus according to the invention, FIG. 23 is a side view for describing an embodiment of the module pressing unit of the display apparatus according to the invention, and FIG. 24 is a cut-away perspective view for describing an embodiment of the module pressing unit of the display apparatus according to the invention.

Referring to FIGS. 22 and 23, a long hole HSc may be defined in a sidewall of the housing HS. The long hole HSc may extend vertically. However, the invention is not limited thereto, and the long hole HSc may extend back and forth. That is, the long hole HSc may extend to a predetermined length in the third direction D3.

The module pressing unit RP may include a pressing roller RP1 and an elastically deformable part RP2. The pressing roller RP1 may include a pressing roller body RPb and a pressing roller connection part RPc. The pressing roller body RPb may have a cylindrical shape extending in the second direction D2. The pressing roller connection part RPc may be coupled to a side surface of the pressing roller body RPb. The pressing roller connection part RPc may be inserted into the long hole HSc. The pressing roller connection part RPc may be inserted into the long hole HSc and supported by the housing HS. One side of the elastically deformable part RP2 may be fixed to the housing HS, and another side thereof may be fixed to the pressing roller RP1. The elastically deformable part RP2 may include a coil spring. However, the invention is not limited thereto, and the elastically deformable part RP2 may include other elastic materials such as rubber, urethane, and sponge. By the elastically deformable part RP2, the pressing roller RP1 may apply a constant force downward.

Referring to FIG. 24, the pressing roller RP1 may come in contact with the display module DM. Since the pressing roller RP1 applies a force downward, the display module DM in contact with the pressing roller RP1 may be pressed downward. Therefore, tension may be applied to the display module DM which is lifted and lowered by the lifting block unit B. Accordingly, the display module DM may always maintain a flat state.

The display module driving device, the display apparatus including the same, and the display apparatus driving method using the same in an embodiment of the invention may uniformly control the left and right speeds of the display module when the display module is lifted/lowered.

The display module driving device, the display apparatus including the same, and the display apparatus driving method using the same in an embodiment of the invention may prevent the display module from being bent and damaged.

The display module driving device, the display apparatus including the same, and the display apparatus driving method using the same in an embodiment of the invention may increase the support area of the display module.

Although the above has been described with reference to embodiments of the invention, those skilled in the art or those of ordinary skill in the art will understand that the invention may be variously modified and changed within the scope not departing from the spirit and technical scope of the invention described in the claims. Therefore, the technical scope of the invention should not be limited to the contents described in the detailed description of the specification, but should be determined by the claims below.

What is claimed is:

1. A display apparatus comprising:
a display module;
a rolling cylinder which the display module is wound on and unwound from; and
a lifting block unit disposed on a rear surface of the display module, the lifting block unit comprising:
a first block portion comprising a first block body in which a first accommodation space is defined;
a second block portion coupled to the first block portion and movable up and down with respect to the first block portion; and
a third block portion connected to an upper portion of the display module and coupled to the second block portion and movable up and down with respect to the second block portion, and comprising a third block body in which a second accommodation space is defined,
wherein
the second block portion is inserted into a first accommodation space defined in an upper portion of the first block portion and a second accommodation space defined in a lower portion of the third block portion, and
wherein a front surface of the first block body and a front surface of the third block body are disposed in a same plane.

2. The display apparatus of claim 1, wherein:
the second block portion comprises a second block body which is inserted into the first accommodation space and the second accommodation space;
a lower surface of the third block body is disposed above an upper surface of the first block body; and
the lower surface of the third block body faces the upper surface of the first block body.

3. The display apparatus of claim 2, wherein, in a state in which the second block body is inserted into the first accommodation space and the second accommodation space, the lower surface of the third block body and the upper surface of the first block body contact each other.

4. The display apparatus of claim 2, wherein:
the first block portion further comprises a lower driving part coupled to the first block body;
the third block portion further comprises an upper driving part which is coupled to the third block body and moves the third block body up and down; and
the second block portion further comprises a corresponding lower driving part which is coupled to the second block body, connected to the lower driving part and moves the second block body up and down and a corresponding upper driving part coupled to the second block body and connected to the upper driving part.

5. The display apparatus of claim 4, wherein:
the lower driving part comprises a lower rack gear extends vertically and fixed to the first block body;
the upper driving part comprises an upper rack gear extends vertically and fixed to the third block body;
the corresponding lower driving part comprises a lower gear motor assembly engaged with the lower rack gear; and
the corresponding upper driving part comprises an upper gear motor assembly engaged with the upper rack gear.

6. The display apparatus of claim 2, wherein:
the second block portion further comprises a guide bar coupled to the second block body and extending vertically;
the third block portion further comprises a guide block coupled to the third block body;
the guide block in which a guide hole passing through the guide block vertically is defined; and
the guide bar is inserted into the guide hole.

7. The display apparatus of claim 1, wherein the lifting block unit further comprises a supporting portion which is coupled to an upper side of the third block portion and fixes the upper portion of the display module.

8. The display apparatus of claim 1, further comprising:
a housing surrounding the rolling cylinder; and
a module pressing unit in the housing,
wherein the module pressing unit comprises:
an elastically deformable part including a first side fixed to the housing; and
a pressing roller which is coupled to a second side of the elastically deformable part opposite to the first side and presses the display module.

9. The display apparatus of claim 8, wherein:
a long hole is defined in a side wall of the housing; and
a portion of the pressing roller is inserted into the long hole.

10. A display module driving device for driving a display module, the display module driving device comprising:
a fixed block unit;
a rolling cylinder which is disposed in front of the fixed block unit and winds and unwinds the display module; and
a lifting block unit comprising:
a first block portion coupled to the fixed block unit and movable up and down with respect to the fixed block unit, the first block portion comprising:
a first block body including an upper side in which a first accommodation space is defined; and
a lower driving part directly coupled to the first block body; and
a second block portion coupled to the first block portion and movable up and down with respect to the first block portion, the second block portion comprising:
a second block body, which is inserted into the first accommodation space; and
a corresponding lower driving part which is coupled to the second block body, engaged with the lower driving part and moves the second block body up and down, and a third block portion directly coupled to the second block portion and movable up and down with respect to the second block portion;

wherein a second accommodation space is defined in a lower side of the third block portion, the second block portion is inserted into the second accommodation space, and a front surface of the first block body and a front surface of the third block body are disposed in a same plane.

11. The display module driving device of claim 10, wherein:

the fixed block unit comprises a fixed block body and a base driving part coupled to the fixed block body; and the first block portion further comprises a corresponding base driving part which is coupled to the first block body, engaged with the base driving part and moves the first block body up and down.

12. The display module driving device of claim 10, wherein:

the lower driving part comprises a lower rack gear extending vertically; and the corresponding lower driving part comprises a lower gear motor assembly engaged with the lower rack gear.

13. The display module driving device of claim 12, wherein:

the lower rack gear comprises a gear bar including a first surface coupled to the first block body and a saw tooth structure disposed on a second surface of the gear bar;

the lower gear motor assembly comprises a motor, a pinion gear coupled to the motor and engaged with the saw tooth structure, and a motor housing surrounding the motor and coupled to the second block body;

a housing insertion groove is recessed inward from a side surface of the gear bar has and extends vertically; and the motor housing comprises a protruding structure which is inserted into the housing insertion groove.

14. The display module driving device of claim 12, wherein the lower gear motor assembly comprises:

a first motor and a second motor arranged above and below each other; and a first pinion gear and a second pinion gear respectively coupled to the first motor and the second motor and engaged with the lower rack gear.

15. The display module driving device of claim 10, wherein:

the lower driving part comprises a first lower driving part and a second lower driving part which are spaced apart from each other in a horizontal direction; and the corresponding lower driving part comprises a first corresponding lower driving part and a second corresponding lower driving part which are respectively engaged with the first lower driving part and the second lower driving part.

16. A method for driving a display apparatus, the method comprising:

moving a lifting block unit up from a fixed block unit; and moving a portion of the lifting block unit up after moving the lifting block unit, wherein:

the lifting block unit comprises:

a first block portion which is coupled to the fixed block unit and comprises a first block body including an upper side in which a first accommodation space is defined;

a second block portion coupled to the first block portion; and a third block portion which is coupled to the second block portion and comprises a third block body including a lower side in which a second accommodation space is defined, in the moving the lifting block unit, the second block portion is inserted into the first accommodation space and the second accommodation space, in the moving the portion of the lifting block unit, the second block portion partially inserted into the second accommodation space is exposed since the third block portion moves up based on the second block portion, and a front surface of the first block body and a front surface of the third block body are disposed in a same plane.

17. The method of claim 16, wherein in the moving the portion of the lifting block unit, the second block portion moves up based on the first block portion so that the second block portion partially inserted into the first accommodation space is exposed.

18. The method of claim 17, wherein:

the first block portion comprises:

a lower driving part coupled to the first block body;

the second block portion comprises:

a second block body inserted into the first accommodation space; and a corresponding lower driving part coupled to the second block body and engaged with the lower driving part; and in the moving the portion of the lifting block unit, the second block portion moves up as the corresponding lower driving part moves up in a state in which the corresponding lower driving part is engaged with the lower driving part.

* * * * *